United States Patent
Isobe et al.

(10) Patent No.: US 7,410,839 B2
(45) Date of Patent: Aug. 12, 2008

(54) THIN FILM TRANSISTOR AND MANUFACTURING METHOD THEREOF

(75) Inventors: Atsuo Isobe, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 46 days.

(21) Appl. No.: 11/410,071

(22) Filed: Apr. 25, 2006

(65) Prior Publication Data

US 2006/0244063 A1 Nov. 2, 2006

(30) Foreign Application Priority Data

Apr. 28, 2005 (JP) ............... 2005-133661

(51) Int. Cl.
- H01L 21/84 (2006.01)
- H01L 21/00 (2006.01)
- H01L 21/336 (2006.01)
- H01L 21/8234 (2006.01)

(52) U.S. Cl. .............. 438/149; 438/151; 438/166; 438/197; 438/795; 438/798; 257/347; 257/57; 257/E21.134; 257/E21.212; 257/E21.414

(58) Field of Classification Search ........... 438/149, 438/151, 166, 197, 795, 798; 257/347, 57, 257/E21.134, E21.212, E21.414
See application file for complete search history.

(56) References Cited

U.S. PATENT DOCUMENTS

| | | | | |
|---|---|---|---|---|
| 5,485,019 A | * | 1/1996 | Yamazaki et al. | 257/57 |
| 5,956,581 A | * | 9/1999 | Yamazaki et al. | 438/166 |
| 6,426,245 B1 | * | 7/2002 | Kawasaki et al. | 438/166 |
| 6,534,826 B2 | | 3/2003 | Yamazaki | |
| 6,555,420 B1 | | 4/2003 | Yamazaki | |
| 6,716,761 B2 | | 4/2004 | Mitsuiki | |

(Continued)

FOREIGN PATENT DOCUMENTS

EP 1 617 483 1/2006

(Continued)

OTHER PUBLICATIONS

*The Advancing Introduction of Plasma Oxynitriding Apparatus Adopted by More Than 10 LSI Makers*, Nikkei Microdevices, Apr. 2005, pp. 100-103.

*Primary Examiner*—Michael S. Lebentritt
*Assistant Examiner*—Mohsen Ahmadi
(74) *Attorney, Agent, or Firm*—Eric J. Robinson; Robinson Intellectual Property Law Office, P.C.

(57) ABSTRACT

The present invention provides a thin film transistor in which a substantial length of a channel is shortened to miniaturize a semiconductor device and a manufacturing method thereof. In addition, the present invention provides a semiconductor device which realizes high-speed operation and high-performance of the semiconductor device and a manufacturing method thereof. Further in addition, it is an object of the present invention to provide a manufacturing method in which a manufacturing process is simplified. The semiconductor device of the present invention has an island-shaped semiconductor film formed over a substrate having an insulating surface and a gate electrode formed over the island-shaped semiconductor film, in which the gate electrode is oxidized its surface by high-density plasma to be slimmed and the substantial length of a channel is shortened.

16 Claims, 20 Drawing Sheets

U.S. PATENT DOCUMENTS

| | | |
|---|---|---|
| 6,773,996 B2 | 8/2004 | Suzawa et al. |
| 6,818,852 B2 | 11/2004 | Ohmi et al. |
| 6,975,018 B2 | 12/2005 | Ohmi et al. |
| 2002/0020497 A1 | 2/2002 | Ohmi et al. |
| 2004/0050494 A1 | 3/2004 | Ohmi et al. |
| 2004/0217431 A1 | 11/2004 | Shimada |
| 2006/0154492 A1 | 7/2006 | Ide et al. |
| 2006/0246633 A1 | 11/2006 | Arai et al. |
| 2006/0246640 A1 | 11/2006 | Kuwashima et al. |
| 2006/0246644 A1 * | 11/2006 | Isobe et al. ............ 438/197 |
| 2006/0246738 A1 * | 11/2006 | Isobe et al. ............ 438/769 |

FOREIGN PATENT DOCUMENTS

| | | |
|---|---|---|
| EP | 1 622 194 | 2/2006 |
| JP | 2002-217170 | 8/2002 |
| JP | 2005-093737 | 4/2005 |
| WO | WO 2004/017396 | 2/2004 |

* cited by examiner

THIN FILM TRANSISTOR AND MANUFACTURING METHOD THEREOF

BACKGROUND OF THE INVENTION

1. Field of the Invention

The present invention relates to a thin film transistor, one feature of which is a manufacturing method of a gate electrode, and the manufacturing method thereof. More specifically, the present invention relates to a semiconductor device such as an ID chip, an RFID, a CPU (central processing unit), a liquid crystal display device, and an organic EL display device, and a manufacturing method thereof.

2. Description of the Related Art

In recent years, an electronic appliance of a semiconductor device such as an ID chip, an RFID, a CPU, a liquid crystal display device, and an organic EL display device has been actively developed. In order to realize high integration and high-speed operation of a semiconductor device, miniaturization of the semiconductor device in a manufacturing process is required.

As a method of manufacturing such a semiconductor device, a method in which a gate electrode is miniaturized by etching, or a method in which a surface of a gate electrode is oxidized by using an anodic oxidation method to shorten a substantial length of a channel can be given (see Patent Document 1).

[Patent Document 1] Japanese Patent Application Laid-Open No. 2002-217170

SUMMARY OF THE INVENTION

There is limitation in miniaturization of a gate electrode in terms of precision or the like when using a conventional etching method. In addition, there is a problem that when miniaturization is conducted only by etching, the number of manufacturing steps is significantly increased (see Patent Document 1).

Further in addition, when miniaturization of a gate electrode is conducted by oxidizing a surface of the gate electrode using an anodic oxidation, a step of dividing the gate electrodes is required after making all the gate electrodes capable of being connected at the same electrical potential. Therefore, the number of manufacturing steps of the semiconductor device is significantly increased, which is a problem.

In view of the foregoing, the present invention provides a thin film transistor in which a substantial length of a channel is shortened to miniaturize a semiconductor device and a manufacturing method thereof. In addition, the present invention provides a thin film transistor which realizes high-speed operation and high-performance of a semiconductor device by shortening a substantial length of a channel and a manufacturing method thereof. Further in addition, it is an object of the present invention to provide a manufacturing method of a thin film transistor in which a manufacturing process is simplified.

One manufacturing method for a thin film transistor according to the present invention comprises, forming an amorphous semiconductor film over a substrate having an insulating surface, forming a crystalline semiconductor film by crystallizing the amorphous semiconductor film, forming an island-shaped semiconductor film by etching the crystalline semiconductor film, forming a gate insulating film over the island-shaped semiconductor film, forming a conductive film over the gate insulating film, and forming a gate electrode by etching the conductive film, wherein the gate electrode is slimmed by oxidizing a surface of the gate electrode using high-density plasma.

One manufacturing method for a thin film transistor according to the present invention comprises, forming an amorphous semiconductor film over a substrate having an insulating surface, forming a crystalline semiconductor film by crystallizing the amorphous semiconductor film, forming an island-shaped semiconductor film by etching the crystalline semiconductor film, forming a gate insulating film over the island-shaped semiconductor film, forming a conductive film over the gate insulating film, forming a gate electrode by etching the conductive film, and slimming the gate electrode by oxidizing a surface of the gate electrode using high-density plasma, wherein an oxide film formed over the surface of the gate electrode is removed.

One manufacturing method for a thin film transistor according to the present invention comprising, forming an amorphous semiconductor film over a substrate having an insulating surface, forming a crystalline semiconductor film by crystallizing the amorphous semiconductor film, forming an island-shaped semiconductor film by etching the crystalline semiconductor film, forming a gate insulating film over the island-shaped semiconductor film, forming a conductive film over the gate insulating film, forming a gate electrode by etching the conductive film, slimming the gate electrode by oxidizing a surface of the gate electrode using high-density plasma, doping the island-shaped semiconductor film with an impurity ion using the gate electrode as a mask, and forming a sidewall on a side surface of the gate electrode, wherein the island-shaped semiconductor film is doped with an impurity ion to have a higher concentration of that of the impurity ion which is added in advance, using the gate electrode and the sidewall as a mask.

One manufacturing method for a thin film transistor according to the present invention comprises, forming an amorphous semiconductor film over a substrate having an insulating surface, forming a crystalline semiconductor film by crystallizing the amorphous semiconductor film, forming an island-shaped semiconductor film by etching the crystalline semiconductor film, forming a gate insulating film over the island-shaped semiconductor film, forming a conductive film over the gate insulating film, forming a gate electrode by etching the conductive film, slimming the gate electrode by oxidizing a surface of the gate electrode using high-density plasma, removing an oxide film formed over the surface of the gate electrode, doping the island-shaped semiconductor film with an impurity ion using the gate electrode as a mask, and forming a sidewall on a side surface of the gate electrode, wherein the island-shaped semiconductor film is doped with an impurity ion to have a higher concentration of that of the impurity ion which is added in advance, using the gate electrode and the sidewall as a mask.

High-density plasma of the present invention has an electron density of $1.0 \times 10^{11}$ cm$^{-3}$ to $1.0 \times 10^{13}$ cm$^{-3}$ and an electron temperature is 0.5 to 1.5 eV.

A thin film transistor according to the present invention comprises a substrate having an insulating surface and an island-shaped semiconductor device formed over the substrate, wherein an oxide film is formed over a surface of the gate electrode by using high-density plasma, and the oxide film contains a rare gas element.

A thin film transistor according to the present invention comprises a substrate having an insulating surface and an island-shaped semiconductor device having an LDD region formed over the substrate, wherein an oxide film is formed over a surface of the gate electrode by using high-density plasma, and the oxide film contains a rare gas element.

According to the present invention, a substantial length of a channel can be shortened by oxidizing a surface of a gate electrode. Therefore, miniaturization of a semiconductor device and decrease in gate potential can be realized. Therefore, high-speed operation and high-performance of a semiconductor device can be realized.

In addition, according to the present invention, a precise oxide film can be formed over the surface of the gate electrode simply compared with the conventional art, so that a manufacturing process can be simplified.

DETAILED DESCRIPTION OF THE INVENTION

Embodiment Mode

Figure 1A:
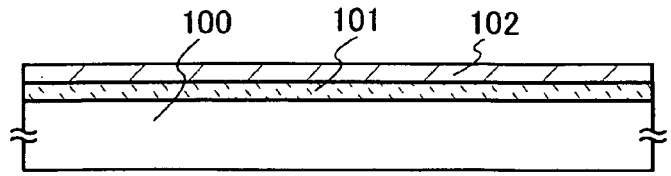
FIGS. 1A to 1F are cross-sectional views for showing a manufacturing process of a thin film transistor of the present invention.

Hereinafter, the embodiment modes of the present invention will be described with reference to the accompanying drawings. The present invention can be carried out in many different modes, and it is easily understood by those skilled in the art that modes and details herein disclosed can be modified in various ways without departing from the purpose and the scope of the present invention. It should be noted that the present invention should not be interpreted as being limited to the description of the embodiment modes to be given below. Note that in the drawings, the same reference numerals are used for the same portions or the portions having the same functions, and the description thereof is not made repeatedly.

In addition, Embodiment Modes 1 to 7 described below can be arbitrarily combined within a practicable range.

Embodiment Mode 1

In this embodiment mode, a manufacturing process of a thin film transistor in which a gate electrode is formed over a substrate having an insulating surface and the gate electrode is slimmed (hereinafter, abbreviated to a thin film transistor), is explained with reference to FIGS. 1A to 1F, 2A to 2D, and 3A to 3C. It is to be noted that in this specification, slimming and miniaturizing are considered to have the same meaning. In addition, in this specification, slimming of an electrode is considered to oxidize an electrode in a thickness of 3 to 50 nm from the surface of the electrode. In this specification, a gate electrode is formed to have a width of 50 nm to 1 µm and the width of the formed gate electrode is reduced by 10% or more by slimming. That is, the gate electrode is oxidized.

A base film 101 is formed to have a thickness of 100 to 300 nm over a substrate 100. As the substrate 100, an insulating substrate such as a glass substrate, a quartz substrate, a plastic substrate, a ceramic substrate, and the like; a metal substrate; a semiconductor substrate; and the like can be used.

As the base film 101, a single layer structure of an insulating film containing oxygen or nitrogen such as silicon oxide, silicon nitride, silicon oxide containing nitrogen, and silicon nitride containing oxygen; or a stacked layer structure formed by combing films of those materials can be employed. Here, silicon oxide is used as the base film.

The base film 101 is provided in order to prevent alkali metal such as Na and alkaline earth metal contained in the substrate 100 from diffusing into a semiconductor and from causing an adverse effect on a characteristic of a semiconductor element. In the case where the substrate 100 is a substrate which contains any amount of alkali metal or alkaline earth metal such as a glass substrate or a plastic substrate, it is effective to provide the base film in order to prevent impurity diffusion. However, when a quartz substrate which does not lead a severe problem of impurity diffusion is used, the base film 101 is not necessarily provided.

A semiconductor film 102 is formed to have a thickness of 10 to 100 nm over the base film 101 (FIG. 1A). A material for the semiconductor film can be selected in accordance with the required characteristics of the thin film transistor, and any of a silicon film, a silicon germanium film, and a silicon carbide film may be used. Here, silicon is used. In the case of using silicon germanium, the concentration of germanium is preferably in the range of approximately 0.01 to 4.5 atomic %. As the semiconductor film, a crystalline semiconductor film that is crystallized by a laser crystallization method using an excimer laser or the like after forming an amorphous semiconductor film or a microcrystal semiconductor film by a sputtering method, an LPCVD method, a plasma CVD method, or the like is preferably used. Alternatively, a semiconductor film may be also crystallized by treating the semiconductor film with heat plasma which is generated by applying DC bias. The microcrystal semiconductor film can be obtained by glow discharge decomposition of a gas containing silicon such as $SiH_4$. The microcrystal semiconductor film can be easily formed by diluting the gas containing silicon with hydrogen, fluorine, or any of the rare gas elements with hydrogen or fluorine.

In addition, it is also possible to apply a rapid thermal annealing method (an RTA method) using a halogen lamp or a crystallization technique using a heating furnace as the crystallization technique. Further, a method in which a metal element such as nickel is added into an amorphous semiconductor film to cause solid-phase growth with the added metal as a crystal nucleus may also be used.

Figure 1B:
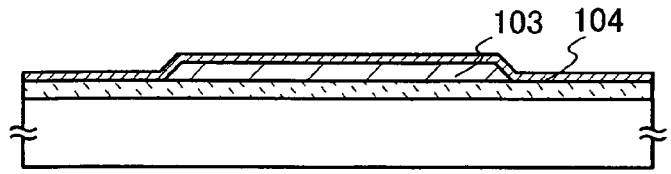

Then, an island-shaped semiconductor film 103 is formed by etching the semiconductor film. A gate insulating film 104 is formed to have a thickness of 2 to 200 nm so as to cover the island-shaped semiconductor film 103 (FIG. 1B). The gate insulating film 104 may have a stacked layer structure formed by appropriately combining any of films of silicon oxide, silicon nitride, silicon oxide containing nitrogen, or silicon nitride containing oxygen, and the like by a CVD method or a sputtering method.

Then, a conductive film 105 which serves as a gate electrode is formed by a sputtering method to have a thickness of 150 to 500 nm over the gate insulating film 104. As the conductive film 105, an aluminum (Al) film, a tungsten (W) film, a molybdenum (Mo) film, or the like can be used. Here, a tungsten film is used as the conductive film.

Figure 1C:
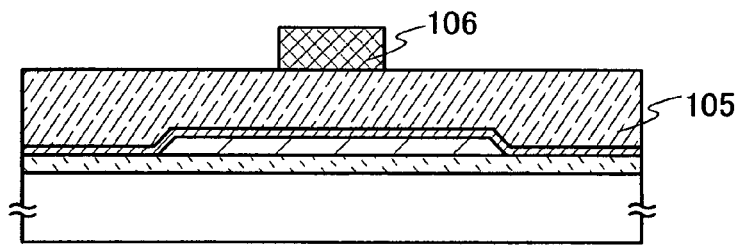

Then, a resist 106 is formed over the conductive film by photolithography using a photo mask (FIG. 1C).

Figure 1D:
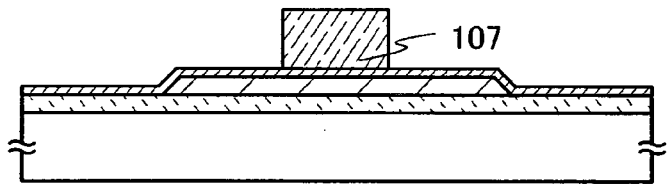

Then, etching is conducted using the resist 106 as a mask (FIG. 1D), thereby the conductive film 105 is etched to be a gate electrode 107. After forming the gate electrode, the resist 106 is removed (FIG. 1D).

In this embodiment mode, a mixed gas of $Cl_2$, $SF_6$, and $O_2$ is used as an etching gas, and the mixture ratio of $Cl_2$:$SF_6$:$O_2$ is 33:33:10 sccm. Plasma is generated by applying a power of 2000 W to a coil-shaped electrode at a pressure of 0.67 Pa. A power of 50 W is applied to a substrate side (sample stage).

Figure 1E:
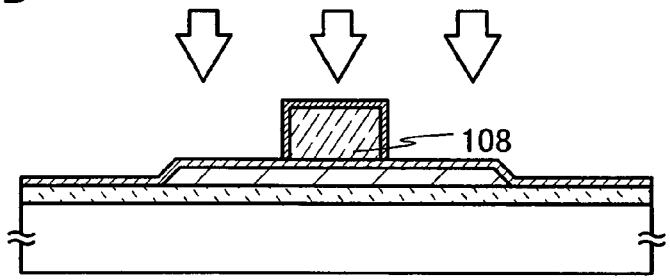

Subsequently, the surface of the gate electrode 107 is oxidized and the gate electrode 107 is slimmed, thereby a gate electrode 108 covered with an oxide film (hereinafter, referred to as a gate electrode 108) is formed (FIG. 1E). The oxide film is formed over the surface of the gate electrode 107 by oxidation using a high-density plasma apparatus. Therefore, a substantial length of a channel can be shortened.

Note that by providing an oxide film over the surface of the gate electrode 108, an offset region is formed between the end of the gate electrode and an impurity region formed in the island-shaped semiconductor film in a subsequent step. When the offset region is not necessary, the oxide film over the surface of the gate electrode may be removed.

Figure 4:
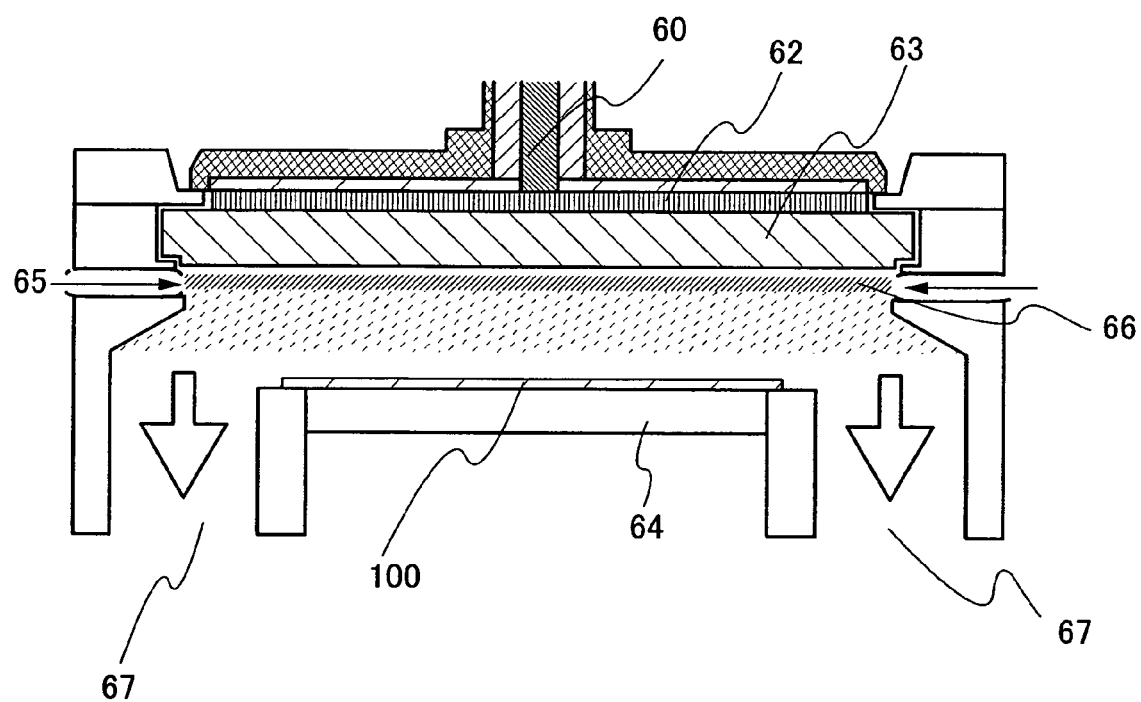
FIG. 4 is a cross sectional view of a plasma apparatus used in the present invention.

In this embodiment mode, a high-density plasma apparatus is used. FIG. 4 shows one example of a high-density plasma apparatus. A treatment chamber is evacuated to vacuum and a gas containing oxygen is introduced through a gas introduction opening 65. In this embodiment mode, a mixed gas of oxygen ($O_2$), hydrogen ($H_2$), and argon (Ar) is used. It is to be noted that the mixed gas to be introduced may contain 0.1 to 100 sccm of oxygen, 0.1 to 100 sccm of hydrogen, and 100 to 5000 sccm of argon. It is to be noted that the mixed gas to be introduced preferably has the mixture ratio of oxygen:hydrogen:argon is 100:1:1. For example, a mixed gas to be introduced may contain 5 sccm of oxygen, 5 sccm of hydrogen, and 500 sccm of argon. Although argon is used in this embodiment mode, another rare gas may be used. Next, the insulating substrate 100 to which has the gate electrode 107 thereover is placed over a support table 64 having a heating mechanism to heat the insulating substrate 100 to 400° C. It is to be noted that the insulating substrate 100 may be heated to 200 to 550° C. (preferably, 250° C. or more). When a plastic substrate is used as the substrate 100, the substrate with a glass transition point of 200° C. or more is needed to be used and the substrate is heated to a temperature of the glass transition point or less. The distance between the insulating substrate 100 and an antenna 62 is 20 to 80 nm (preferably, 20 to 60 nm).

Next, a microwave is applied from a waveguide 60 to the antenna 62. In this embodiment mode, a microwave with a frequency of 2.45 GHz is applied. The microwave applied from the antenna 62 is introduced to the treatment chamber through a dielectric plate 63 in the treatment chamber, thereby high-density plasma 66 containing an oxygen gas, a hydrogen gas, and an argon gas is generated. In the high-density plasma 66 containing the oxygen gas, the hydrogen gas, and the argon gas; the argon gas is excited by the introduced microwave to generate Ar radical. Then Ar radical in an intermediate excited state collides with oxygen molecules and hydrogen molecules to form OH radical. The OH radical reacts with a material of the gate electrode to form an oxide film on the surface of the gate electrode 107. In this embodiment mode, since molybdenum is used for the gate electrode, a molybdenum oxide film is formed on the surface of the gate electrode. The oxygen gas, the hydrogen gas, and the argon gas used in this step are exhausted outside the treatment chamber through an exhaust port 67.

The plasma generated using the plasma apparatus as shown in FIG. 4 has a low electron temperature (1.5 eV or less (preferably, 0.5 to 1.5 eV)), and a high electron density ($1.0\times10^{11}$ $cm^{-3}$ or more (preferably, $1.0\times10^{11}$ $cm^{-3}$ to $1.0\times10^{13}$ $cm^{-3}$). Therefore, an oxide film with little plasma damage can be formed at a low temperature.

It is suggested that a rare gas is contained in the oxide film in this step. Therefore, a sample to which the plasma treatment of this step is conducted to form an oxide film is manufactured over a substrate and a measurement thereof using TXRF is conducted. Here, Ar is used as the rare gas for the plasma treatment. As the result of the measurement, a concentration of Ar contained in the oxide film is approximately $1\times10^{15}$ to $1\times10^{16}$ $atoms/cm^3$. Therefore, the rare gas used for high-density plasma treatment is contained in the oxide film which is formed in this step at the similar concentration ($1\times10^{15}$ to $1\times10^{16}$ $atoms/cm^3$).

Figure 5A:
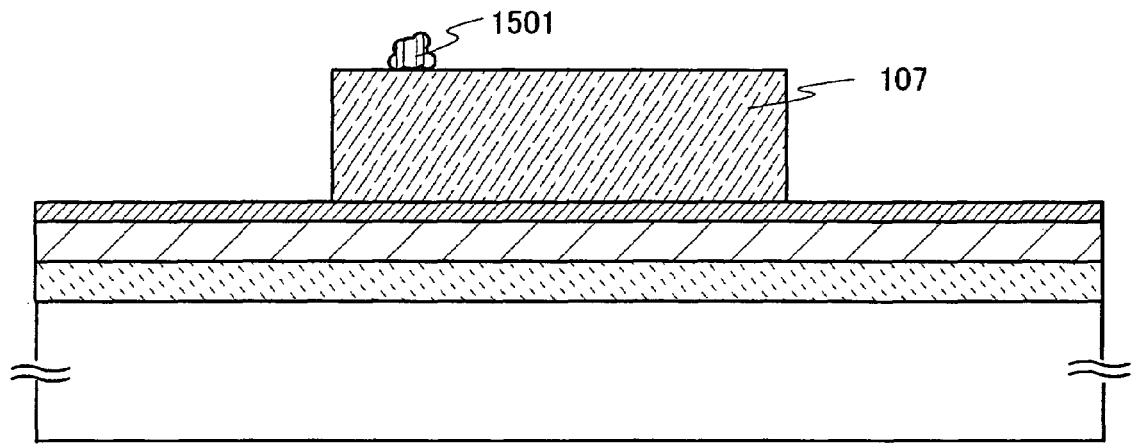
FIGS. 5A and 5B are cross-sectional views for showing a manufacturing process of a semiconductor device of the present invention.

In addition, there is a possibility that a dust is attached over the film formed by a CVD method and a sputtering method. There is another possibility that a part of resist is remained over the surface of the gate electrode in the step of removing the resist after etching the gate electrode. FIG. 5A shows a state in which a dust 1501 is attached to the surface of the gate electrode. A case in which plasma oxidation of this embodiment mode is conducted to the gate electrode 107 with the dust attached thereover is described.

Figure 5B:
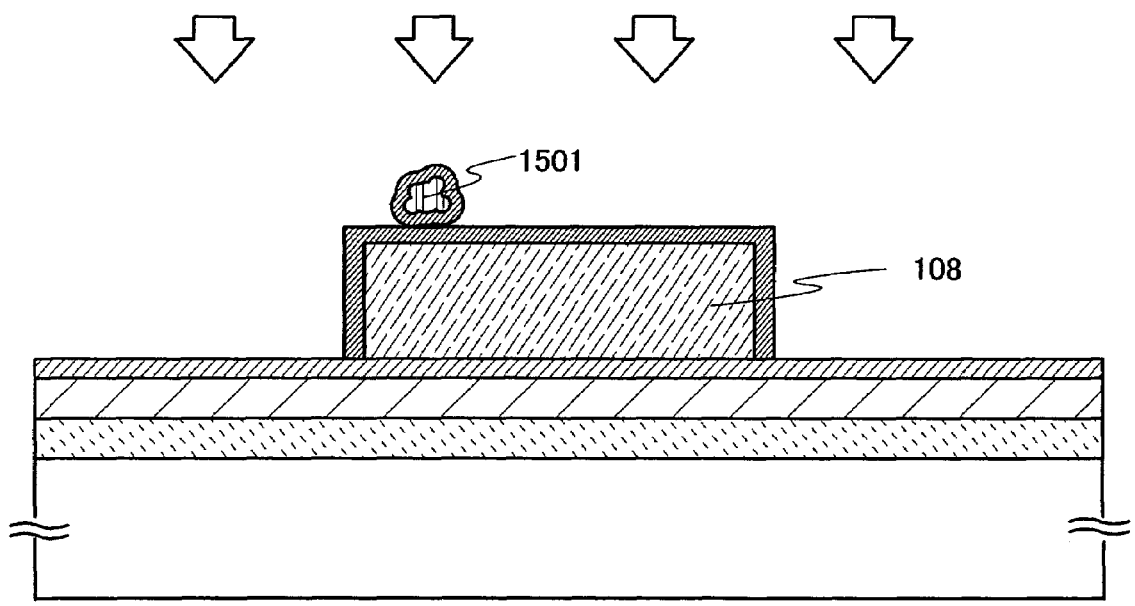

By conducting the plasma oxidation of this embodiment mode, the surface of the gate electrode is oxidized not only the part without dust but also the part where the dust 1501 is attached (FIG. 5B). The volume of the dust 1501 is increased due to oxidation of the surface or the whole part of the dust 1501. Therefore, the dust 1501 can be removed from the surface of the gate electrode 108 having the oxide film by a simple cleaning process such as a brush cleaning. That is, removing of a dust even at the nanolevel becomes easier by plasma oxidation.

Next, doping of an impurity ion is conducted to the island-shaped semiconductor film 103 (FIG. 1F) to form a low-concentration impurity region. The island-shaped semiconductor film 103 is doped with an impurity element through the gate insulating film to form low-concentration impurity regions 110a and 110b in the island-shaped semiconductor film. In addition, a channel-formation region 111 is also formed. The element concentrations of each of the low-concentration impurity regions 110a and 110b is $1\times10^{16}$ to $1\times10^{20}$ atoms/cm$^3$ (preferably, $1\times10^{16}$ to $5\times10^{18}$ atoms/cm$^3$). As a doping method, an ion doping method or an ion implantation method can be used. In order to manufacture a p-type semiconductor, for example, boron (B), gallium (Ga), or the like is used, whereas phosphorus (P), arsenic (As), or the like is used in order to manufacture an n-type semiconductor.

Next, an insulating layer is formed so as to cover the gate insulating film 104 and the gate electrode 108. The insulating layer is formed by sequentially forming a silicon oxide film containing nitrogen by a plasma CVD method to have a thickness of 100 nm, and forming a silicon oxide film by a thermal CVD method to have a thickness of 200 nm.

Figure 2A:
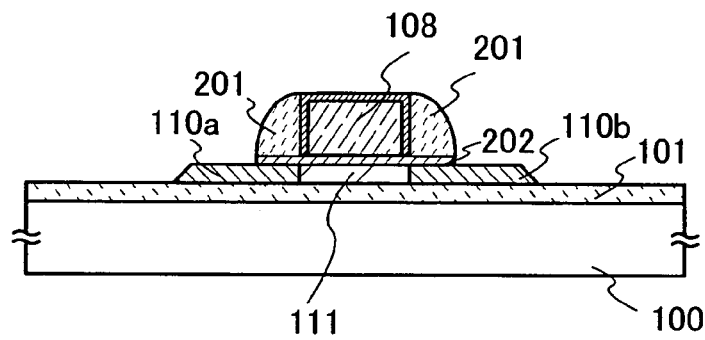
FIGS. 2A to 2D are cross-sectional views for showing a manufacturing process of a thin film transistor of the present invention.

Subsequently, the insulating layer is selectively etched by anisotropic etching mainly in a perpendicular direction to form a insulating layer (hereinafter referred to as a sidewall) 201 which is in contact with a side surface of the gate electrode 108 (FIG. 2A). The sidewall 201 is used as a mask to form silicide in a subsequent step over a source region and a drain region. In addition, by this etching, a part of the gate insulating film is also removed to form a gate insulating film 202 so as to expose a part of the semiconductor film. The exposed parts of the semiconductor film become the source region and the drain region later. When an etching selective ratio of the insulating film and the semiconductor film is low, the exposed semiconductor film is etched to some extent, and the film thickness thereof becomes thin.

Figure 2B:
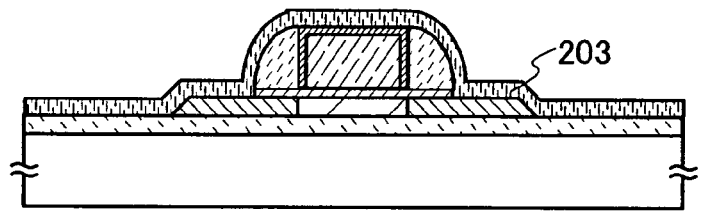

Next, a metal film 203 is formed to cover the exposed part of the semiconductor film, the sidewall 201, and the gate electrode 108 (FIG. 2B). The metal film 203 is formed from a material which reacts with the semiconductor film to form silicide. As the metal film, for example, a nickel film, a titanium film, a cobalt film, a platinum film, or a film containing an alloy having at least two kinds of these elements, or the like can be given. In this embodiment mode, a nickel film is used as the metal film. The nickel film is formed by sputtering at a room temperature by deposition power of 500 W to 1 kW.

After the nickel film is formed, silicide layers 204a and 204b, low-concentration impurity regions 205a and 205b are formed by heat treatment. In this embodiment mode, the silicide layers 204a and 204b become nickel silicide. As the heat treatment, RTA, furnace annealing, or the like can be used. At this time, by controlling a film thickness of the metal film, a heating temperature, and a heating time; a structure in which only the surface of the semiconductor layer becomes silicide or a structure in which the whole part of the semiconductor layer becomes silicide is formed. For example, the structure shown in FIG. 2C can be obtained by forming the metal film so as to have a film thickness that is equal to or more than half of that of the semiconductor film, by forming the metal film with a higher heating temperature, or by forming the metal film with a longer heating time.

Then, nickel which has not reacted is removed. Here, nickel which has not reacted is removed by using an etching solution containing HCl, HNO$_3$, and H$_2$O at a ratio of 3:2:1.

Then, an interlayer insulating film 206 is formed. The interlayer insulating film 206 is formed by using an organic material or an inorganic material. The interlayer insulating film 206 may have a single layer structure or a stacked layer structure. A contact hole is formed in the interlayer insulating film 206 by etching so that the silicide layers 204a and 204b, which serve as the source region or the drain region later, are exposed. Then, a conductive layer may be formed to fill the contact hole and the conductive layer may be etched to form a wiring 207.

Figure 2C:
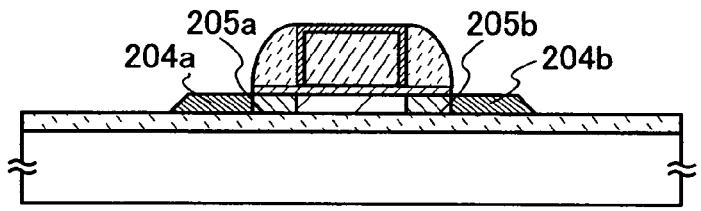
Figure 3A:
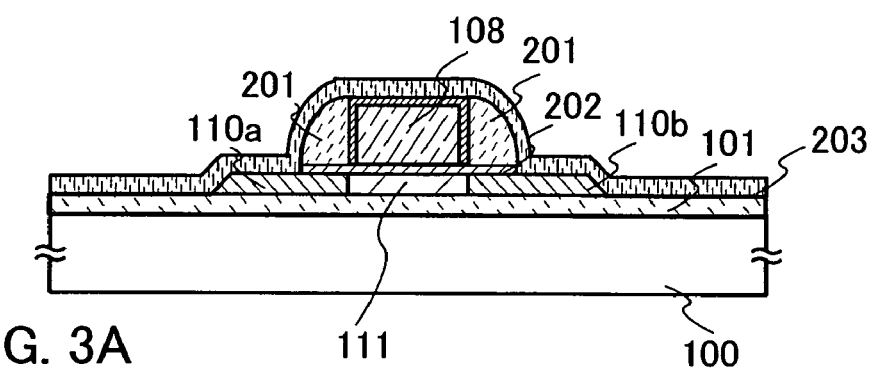
FIGS. 3A to 3C are cross-sectional views for showing a manufacturing process of a thin film transistor of the present invention.
Figure 3B:
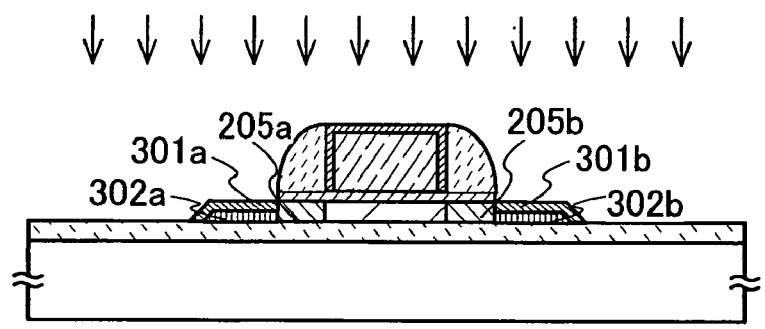

On the other hand, when a structure in which only the surface of the semiconductor layer becomes silicide is employed, unlike the structure shown in FIG. 2C, doping of an impurity ion may be conducted to the semiconductor layer to form a high-concentration impurity region using the sidewall 201 as a mask in FIG. 3B after silicide layers 301a and 301b are formed over the surface of the semiconductor layer in a step shown in FIG. 3A. High-concentration impurity regions 302a and 302b which serve as the source region and the drain region later are formed by the doping. The doping is conducted so that each high-concentration impurity region has an impurity element concentration of $1\times10^9$ to $1\times10^{21}$ atoms/cm$^3$. At the same time, a low-concentration impurity region is also formed. As a doping method, an ion doping method or an ion implantation method can be used. In order to manufacture a p-type semiconductor, boron (B), gallium (Ga), or the like is used, whereas phosphorus (P), arsenic (As), or the like is used in order to manufacture an n-type semiconductor.

Then, the impurity is activated and the interlayer insulating film 206 is formed as in the case of shown in FIGS. 2A to 2D in which the silicide layers are formed in the whole part of the semiconductor layer. The interlayer insulating film 206 is formed by using an organic material or an inorganic material. The interlayer insulating film 206 may have a single layer structure or a stacked layer structure. A contact hole is formed in the interlayer insulating film 206 by etching so that the silicide layers 205a and 205b, which serve as the source region or the drain region later, are exposed. Then, a conductive layer may be formed to fill the contact hole and the conductive layer may be etched to form a wiring.

Before the interlayer insulating film is formed, or after a first layer or a second layer of the interlayer insulting film is formed in the case of the interlayer insulating film has a stacked layer structure, thermal activation of the impurity regions may be conducted. Laser light irradiation, RTA, heat treatment using a furnace or the like can be used as the thermal activation. Since silicide is used to form an ohmic contact of the impurity region and a wiring in this structure, a step of thermal activation of the impurity region can be omitted.

Figure 2D:
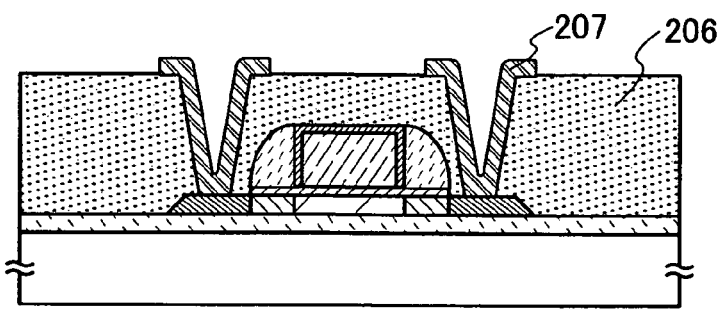
Figure 3C:
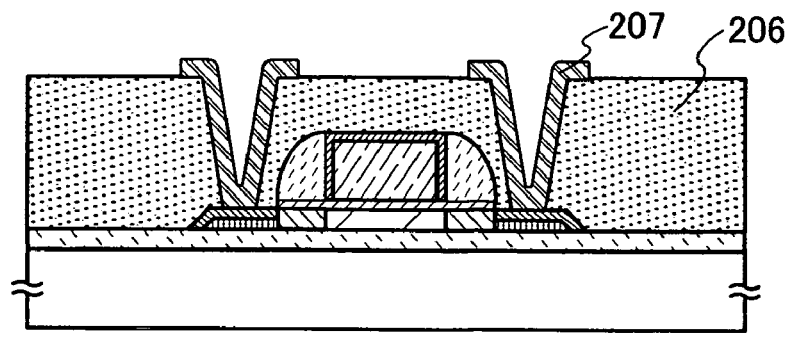

When the structure of FIG. 3C is compared with the structure of FIG. 2D, an area in which the silicide layers 301a and 301b are in contact with a part of the semiconductor film that is not silicide, is larger than that of the structure of FIG. 2D. Therefore, contact resistance of the silicide layers 301a and 301b and the part of the semiconductor film other than the silicide layer becomes low, so that parasitic resistance is lower than that of the structure of FIG. 2D.

On the other hand, when the structure of FIG. 2D is compared with the structure of FIG. 3C resistance of the source region and the drain region is lower. In addition, since a step of doping of an impurity ion for forming the high-concentration impurity region is not required, the number of manufacturing steps for forming the structure of FIG. 2D is smaller than that of the structure of FIG. 3C.

In FIGS. 3A to 3C, doping of the impurity ion for forming the high-concentration impurity region is conducted after forming the silicide; however, the metal film 203 may be provided to form silicide after doping of the impurity ion. In addition, in order to form the structure of FIG. 3C, the silicide layers 301a and 301b may be formed after doping of the impurity ion by using the sidewall 201 as a mask.

In the thin film transistor formed according to this embodiment mode having a structure above described, a substantial length of a channel can be shortened. Therefore, a gate electrode can be miniaturized and a gate capacitance can be reduced, thereby high-speed operation and high-performance of the semiconductor device can be realized. In addition, the manufacturing process can be simplified.

A structure of the thin film transistor is not limited to a single-gate structure having one channel formation region as shown in this embodiment mode. The structure may be a multi gate structure with a plurality of channel formation regions. For example, a double-gate structure having two channel formation regions or a triple-gate structure having three channel formation regions may be employed. In addition, a transistor in a peripheral driver circuit region may have a single-gate structure or a multi-gate structure such as a double-gate structure or a triple-gate structure.

It is to be noted that the present invention is not limited to the manufacturing method of a thin film transistor described in this embodiment mode, but can also be applied to a top gate type (planar type), a bottom gate type (inversed staggered type), or a dual gate type in which two gate electrodes are respectively arranged at the top and bottom of a channel formation region, each with a gate insulating film interposed therebetween, or other structures.

Embodiment Mode 2

In this embodiment mode, a method of hydrogenation of a semiconductor layer is described with reference to FIGS. 17A, 17B, 18A, and 18B. It is to be noted that the thin film transistor used in this embodiment mode is manufactured by the same method as that of the structure of FIGS. 1A to 1F in Embodiment Mode 1 and the same description is not made. In addition, in this embodiment mode, the same reference numerals in Embodiment Mode 1 are used for the same portions, and the detailed description thereof is not made repeatedly.

Figure 1F:
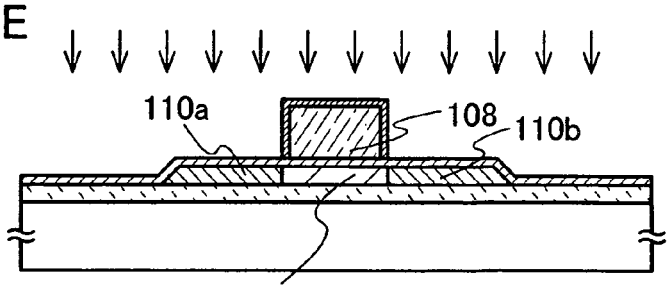

As shown in FIG. 1F in Embodiment Mode 1, a structure which has an impurity region and a channel formation region is manufactured. Then, an impurity element doped to the impurity region is activated. Laser light irradiation, RTA, heat treatment using a furnace, or the like can be used in the activation step.

Then, hydrogen plasma treatment is conducted using a high-density plasma apparatus to oxide a surface of a gate electrode. As a gas, hydrogen ($H_2$) or a mixed gas of hydrogen ($H_2$) and a rare gas is introduced. In this embodiment mode, the mixed gas of hydrogen ($H_2$) and argon (Ar) is introduced.

Figure 17A:
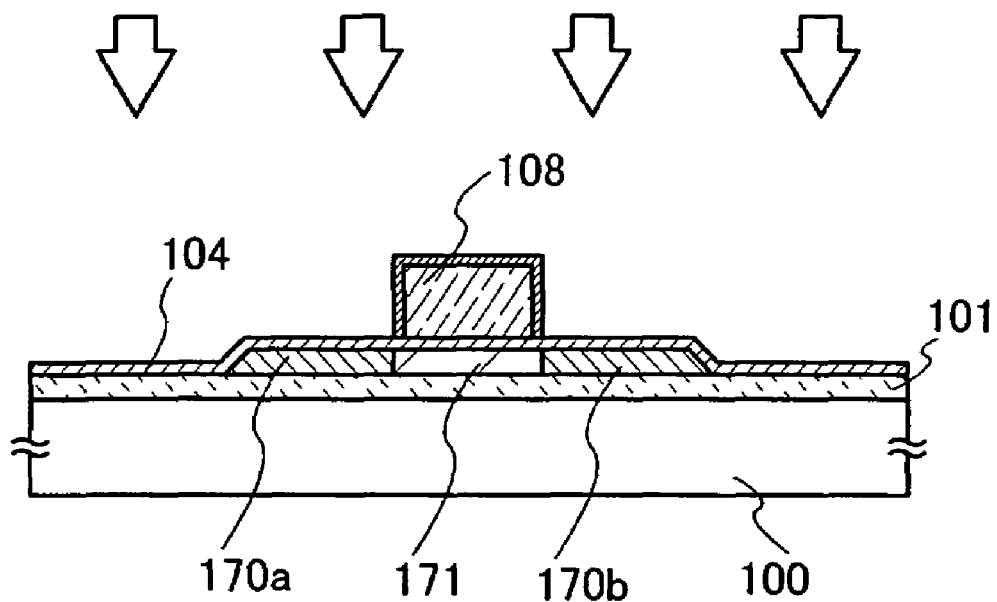
FIGS. 17A and 17B are cross-sectional views for showing a manufacturing process of a thin film transistor of the present invention.

Then, an insulating substrate 100 in which an impurity element is activated is heated to 350 to 450° C. to conduct hydrogen plasma treatment using a high-density plasma apparatus. In this step, introduced hydrogen radical (H radical) reacts with the semiconductor layer and the gate insulating film to form a hydrogenated channel formation region 171 and impurity regions 170a and 170b which serve as a source region and a drain region (FIG. 17A).

It is to be noted that heat treatment may be conducted at 350 to 450° C. in an atmosphere containing hydrogen after the hydrogen plasma treatment.

Figure 17B:
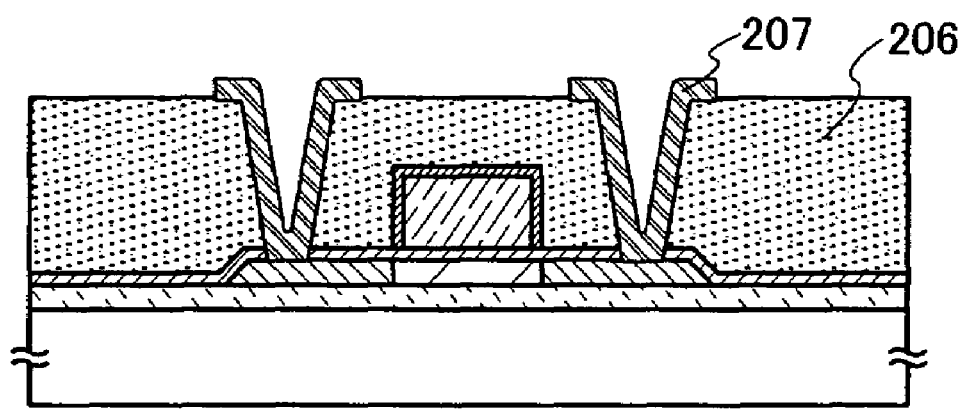

Then, an interlayer insulating film 206 is formed as in Embodiment Mode 1. The interlayer insulating film 206 is formed by using an organic material or an inorganic material. The interlayer insulating film 206 may have a single layer structure or a stacked layer structure. A contact hole is formed in the interlayer insulating film 206 by etching so that the impurity regions 170a and 170b, which serve as the source region or the drain region later, are exposed. Then, a conductive layer may be formed to fill the contact hole and the conductive layer may be etched to form a wiring 207 (FIG. 17B).

It is to be noted that the step of hydrogenation of the semiconductor layer requires to be conducted after the activation of the impurity because hydrogen is eliminated from the semiconductor layer when the semiconductor layer is heated to 500° C. or more.

Figure 18A:
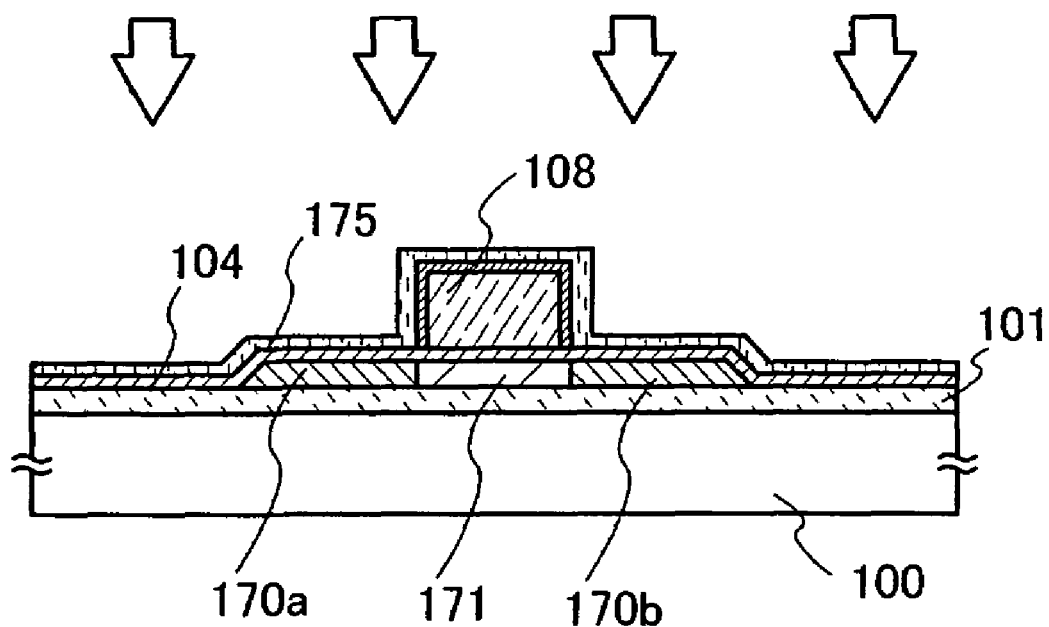
FIGS. 18A and 18B are cross-sectional views for showing a manufacturing process of a thin film transistor of the present invention.
Figure 18B:
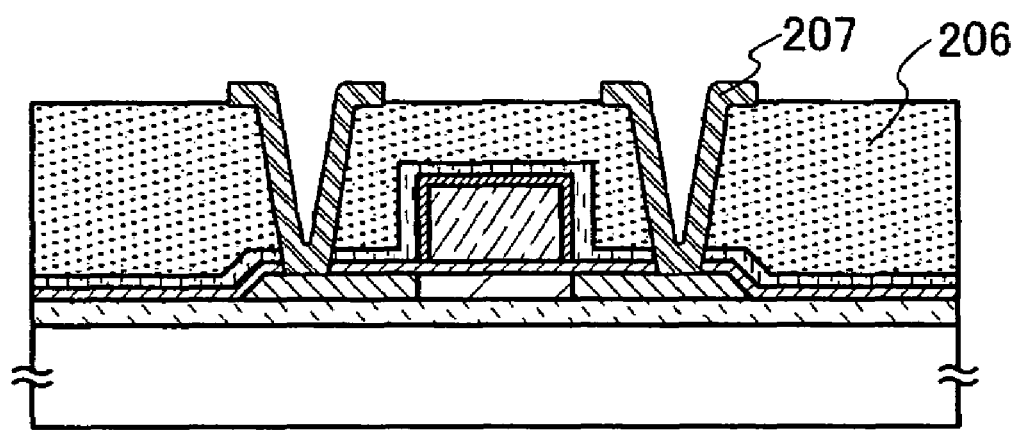

Then, a method of hydrogenation of the semiconductor layer with a slimmed gate electrode having a protective film thereover is described with reference to FIGS. 18A and 18B. It is to be noted that the thin film transistor used in this embodiment mode is manufactured by the same method as that of the structure of FIGS. 1A to 1F in Embodiment Mode 1 and the same description is not made. In addition, in this embodiment mode, the same reference numerals in Embodiment Mode 1 are used for the same portions, and the detailed description thereof is not made repeatedly.

As shown in FIG. 1F in Embodiment Mode 1, a structure which has an impurity region and a channel formation region is manufactured. Then, an impurity element doped to the impurity region is activated. Laser light irradiation, RTA, heat treatment using a furnace, or the like can be used as in the activation step.

Then, a protective film 175 is formed by a plasma CVD method so as to cover the gate electrode 108 and the gate insulating film 104. As the protective film, a silicon nitride film, a silicon nitride oxide film, or a silicon oxide nitride film is preferably used, but it is not limited thereto. In addition, the forming method is not limited to a plasma CVD method.

Then, hydrogen plasma treatment is conducted to the protective film 175 using a high-density plasma apparatus to oxide a surface of the gate electrode. As a gas, hydrogen ($H_2$) or a mixed gas of hydrogen ($H_2$) and a rare gas is introduced. In this embodiment mode, the mixed gas of hydrogen ($H_2$) and argon (Ar) is introduced.

Then, the insulating substrate 100 with the protective film 175 formed thereover is heated to 350 to 450° C. to conduct hydrogen plasma treatment using a high-density plasma apparatus. In this step, hydrogen radical (H radical) introduced to the protective layer 175 reacts with the semiconductor layer to form a hydrogenated channel formation region 171 and impurity regions 170a and 170b which serve as a source region and a drain region (FIG. 18A).

It is to be noted that ammonia ($NH_3$) is introduced instead of hydrogen. In that case, NH radical reacts with a protective film to hydrogenate a semiconductor layer. At the same time, a nitride film (not shown) is formed over a protective film. Therefore, a film property of the protective film can be improved with a dense nitride film formed thereover.

It is to be noted that heat treatment may be conducted at 350 to 450° C. in an atmosphere containing hydrogen after the hydrogen plasma treatment.

Then, an interlayer insulating film 206 is formed as in Embodiment Mode 1. The interlayer insulating film 206 is formed by using an organic material or an inorganic material. The interlayer insulating film 206 may have a single layer structure or a stacked layer structure. A contact hole is formed in the interlayer insulating film 206 by etching so that the impurity regions 170a and 170b, which serve as the source region or the drain region later, are exposed. Then, a conductive layer may be formed to fill the contact hole and the conductive layer may be etched to form a wiring 207 (FIG. 18B).

It is to be noted that the step of hydrogenation of the semiconductor layer requires to be conducted after the activation of the impurity because hydrogen is eliminated from the semiconductor layer when the semiconductor layer is heated to 500° C. or more.

Embodiment Mode 3

In this embodiment mode, a method for forming a p-channel thin film transistor and an n-channel thin film transistor over one substrate is described with reference to FIGS. 6A to 6F. It is to be noted that the n-channel thin film transistor and the p-channel thin film transistor have the structure shown in FIG. 3C of Embodiment Mode 1. However, the structure is not limited thereto, and the structures of the thin film transistors in Embodiment Modes 1 and 2 are arbitrarily employed to the n-channel thin film transistor and the p-channel thin film transistor depending on the application. In addition, in this embodiment mode, the same reference numerals are used for the same portions as in Embodiment Modes 1 and 2, and a detailed explanation is omitted.

After an amorphous semiconductor film is formed over a substrate 100 and channel doping is conducted to the amorphous semiconductor film, the amorphous semiconductor film is crystallized by the same method as that of Embodiment Mode 1 to form a crystalline semiconductor film. Then, island-shaped semiconductor films 103a and 103b are formed by etching. The crystalline semiconductor film represents a crystalline silicon film here. In addition, as a base film 101 that is in contact with the substrate 100, a silicon nitride film containing oxygen is used.

Subsequently, a gate insulating film 104 is formed so as to cover the island-shaped semiconductor films 103a and 103b. As the gate insulating film 104, a silicon oxide film containing nitrogen is formed by a plasma CVD method. Then, gate electrodes 107a and 107b are formed by the same method as that of Embodiment Mode 1 over the island-shaped semiconductor films 103a and 103b, respectively.

Then, the surfaces of the gate electrode 107 are oxidized and the gate electrodes 107 are slimmed, thereby gate electrodes 108a and 108b each covered with an oxide film (hereinafter referred to as the gate electrodes 108a and 108b) are formed. The oxide film over the surface of the gate electrode is formed by the same method as that of Embodiment Mode 1. By this step, a substantial length of a channel can be shortened.

It is to be noted that the oxide film formed over the surface of the gate electrode may be removed.

Figure 6A:
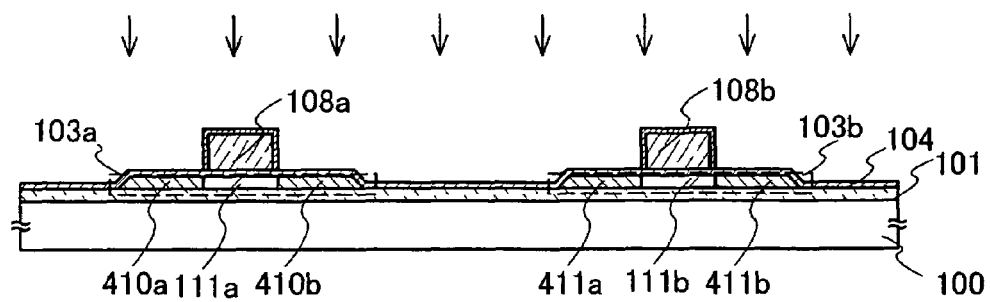
FIGS. 6A to 6F are cross-sectional views for showing a manufacturing process of a semiconductor device of the present invention.

By using the gate electrodes 108a and 108b as masks, the island-shaped semiconductor films 103a and 103b are doped with phosphorus that is an n-type impurity element to form low-concentration impurity regions by ion doping. Accordingly, in the island-shaped semiconductor film 103a, n-type low-concentration impurity regions 410a and 410b which do not overlap with the gate electrode 108a are formed and a channel formation region 111a is formed under the gate electrode 108a. Similarly, in the island-shaped semiconductor film 103b, n-type low-concentration impurity regions 411a and 411b which do not overlap with the gate electrode 108b are formed and a channel formation region 111b are formed under the gate electrode 108b. Doping of phosphorus is conducted so that the low-concentration impurity regions contain phosphorus at a concentration of $1\times10^{16}$ to $5\times10^{18}$ atoms/cm³ (FIG. 6A).

Figure 6B:
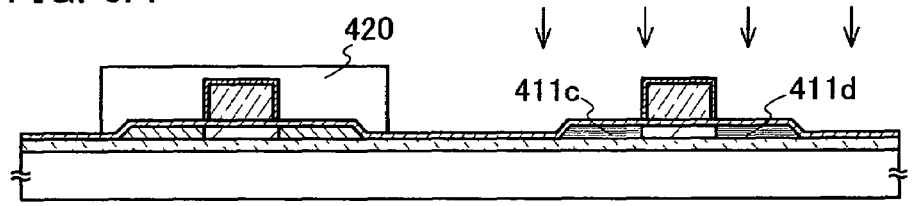

Subsequently, a resist mask 420 is formed so as to cover the island-shaped semiconductor film 103a and the gate electrode 108a. And then, by using the gate electrode 108b as a mask, the island-shaped semiconductor film 103b is doped with boron that is a p-type impurity element to form a low-concentration impurity region by ion doping. Accordingly, in the island-shaped semiconductor film 103b, p-type low-concentration impurity regions 411c and 411d which do not overlap with the gate electrode 108b are formed. Doping of boron is conducted so that the p-type low-concentration impurity regions contain boron at a concentration of $1\times10^{18}$ to $1\times10^{19}$ atoms/cm³. The p-type low-concentration impurity regions have been already doped with phosphorus and contains phosphorous in a low-concentration; however, a concentration of boron is higher than that of phosphorus, and n-type conductivity is converted by p-type conductivity (FIG. 6B).

Figure 6C:
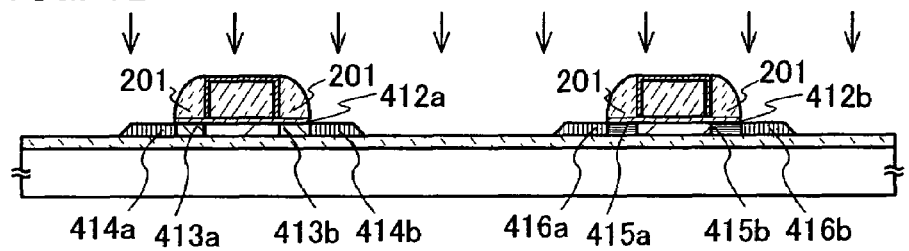

Then, a sidewall is formed. A silicon oxide film is formed as an insulating film so as to cover the island-shaped semiconductor films 103a and 103b, and the gate electrodes 108a and 108b. Anisotropic dry etching is conducted to form a sidewall 201. Then, gate insulating films 412a and 412b are formed by etching the gate insulating film 104 using the sidewall 201 as a mask. Accordingly, each ends of the island-shaped semiconductor films 103a and 103b are exposed (FIG. 6C). When an etching selective ratio of the gate insulating film to the exposed part of the island-shaped semiconductor film is low, the island-shaped exposed semiconductor film is etched while forming the gate insulating films 412a and 412b, and a film thickness thereof becomes thin.

Next, by using the sidewalls 201 and the gate electrodes 108a and 108b as masks, the n-type low-concentration impurity regions 410a and 410b are doped with phosphorus that is an n-type impurity element in the self-alignment manner to form high-concentration impurity regions. Accordingly, n-type high-concentration impurity regions 414a and 414b are formed. The n-type high-concentration impurity regions 414a and 414b are doped with phosphorus so as to contain phosphorus at a concentration of $1\times10^{20}$ to $1\times10^{21}$ atoms/cm³. At the same time, n-type low-concentration impurity regions 413a and 414b are formed. Since a part of the p-type low-concentration impurity regions 411c and 411d is also doped with phosphorus so as to contain phosphorus at a high concentration, the exposed part of the island-shaped semiconductor film becomes n-type high-concentration impurity regions 416a and 416b. Further, by this doping, p-type low-concentration impurity regions 415a and 415b are formed in the island-shaped semiconductor film 103b.

Figure 6D:
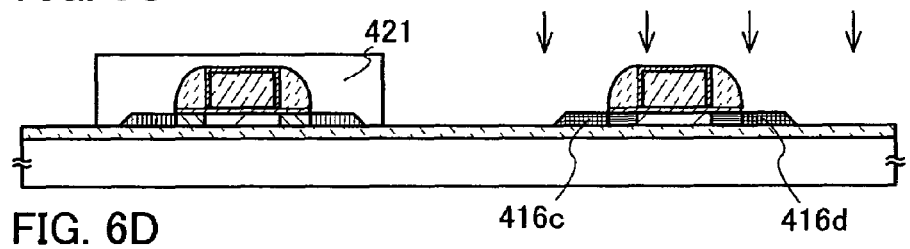

Next, a resist mask 421 is formed so as to cover the island-shaped semiconductor film 103a, the gate electrode 108a, and the sidewall 201. And then, by using the gate electrode 108b and the sidewall 201 as masks, the exposed part of the island-shaped semiconductor film 103b is doped with boron that is a p-type impurity element in the self-alignment manner to form high-concentration impurity regions. Accordingly, p-type high-concentration impurity regions 416c and 416d are formed. The p-type high-concentration impurity regions have already been n-type high-concentration impurity regions doped with phosphorus, however, the n-type conductivity is converted by p-type conductivity by doping of boron. The p-type high-concentration impurity regions 416c and 416d are doped with boron by ion doping so as to contain boron at a concentration of $2\times10^{20}$ to $5\times10^{21}$ atoms/cm³. Thereafter, the resist mask 421 is removed (FIG. 6D).

Figure 6E:
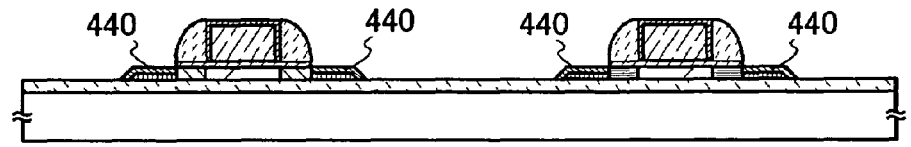

Then, a metal film is formed over the entire surface so as to cover the exposed part of the semiconductor film, and heat treatment is conducted at a temperature at which the metal film and the semiconductor film react with each other and a silicide layer 440 is formed. The silicide layer 440 is formed over the surface of the p-type and n-type high-concentration impurity regions. In this embodiment mode, a nickel film is formed as the metal film, and nickel silicide is formed as the silicide layer 440. Thereafter, the metal film is removed (FIG. 6E).

Then, as a first layer of an interlayer insulating film, a silicon oxide film 450 containing nitrogen is formed to have a thickness of 50 nm.

Thereafter, activation of the formed impurity regions is conducted by heat treatment. Laser light irradiation, RTA, heat treatment using a furnace or the like can be used as the heat treatment. However, since silicide is formed to lower resistance of the source region and the drain region sufficiently in the present invention, a step of activation may be omitted.

Figure 6F:
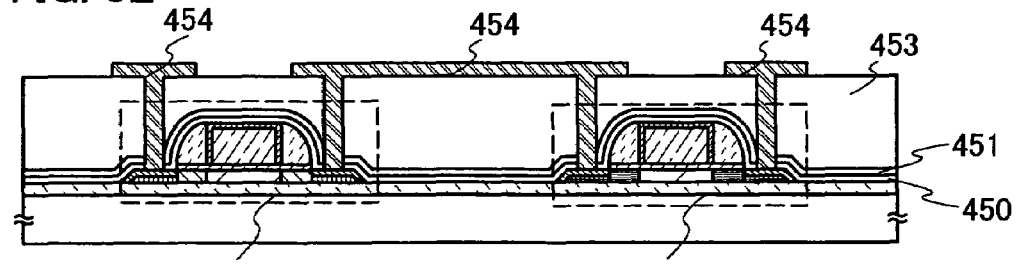

A silicon nitride film 451 that is a second layer of the interlayer insulating film is formed to have a thickness of 100 nm and a silicon oxide film 453 that is a third layer of the interlayer insulating film is formed to have a thickness of 600 nm so as to be stacked sequentially. A contact hole reaching the silicide layers 440 is formed in the interlayer insulating film. Then, a titanium film having a thickness of 60 nm, a titanium nitride film having a thickness of 40 nm, an aluminum film having a thickness of 500 nm, a titanium film having a thickness of 60 nm, and a titanium nitride film having a thickness of 40 nm are stacked sequentially so as to fill the contact holes. Then, the stacked film is etched to form a wiring 454 which serves as a source electrode or a drain electrode (FIG. 6F).

By the foregoing process, an n-channel thin film transistor 460 and a p-channel thin film transistor 461 each having an LDD structure are formed. In the thin film transistor formed according to this embodiment mode having a structure above described, a substantial length of a channel can be shortened. Therefore, a gate electrode can be miniaturized and a gate capacitance can be reduced, thereby high-speed operation and high-performance of the semiconductor device can be realized. In addition, the manufacturing process can be simplified.

It is to be noted that in this embodiment mode, so-called counter doping, in which a semiconductor film of a p-channel thin film transistor is also doped with an n-type impurity element, is conducted; however, the method is not limited thereto. The semiconductor film 103*b* may be prevented from being doped with phosphorus by covering the p-channel thin film transistor with a resist mask or the like while conducting doping of phosphorus.

Embodiment Mode 4

In the foregoing embodiment modes, an example in which a thin film transistor having a gate electrode with an oxide surface is described. In this embodiment mode, a method of forming an oxide film over a surface of a gate electrode is described.

Figure 7:
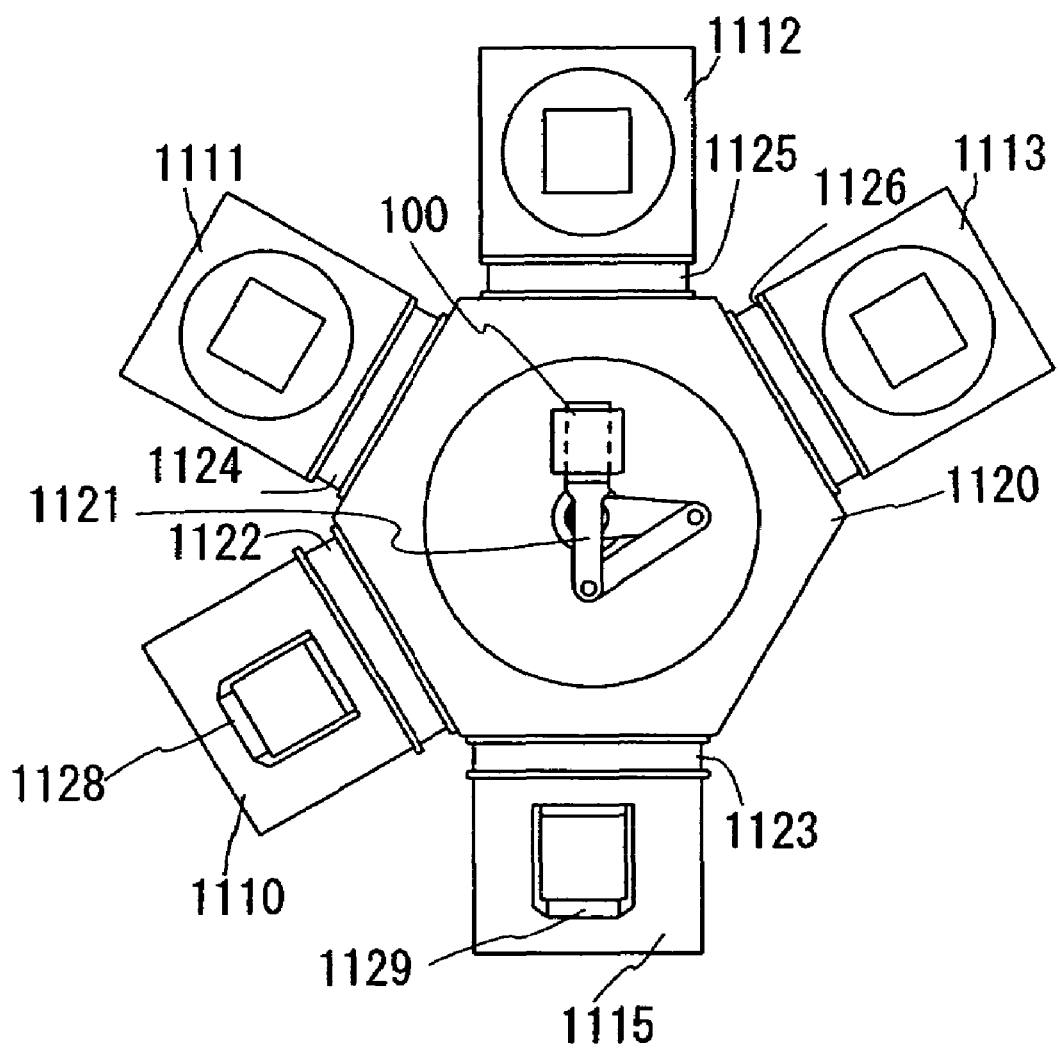
FIG. 7 is a top view of a plasma apparatus used in the present invention.

An example of an apparatus provided with a plurality of chambers is shown in FIG. 7. It is to be noted that FIG. 7 is a top view of a constitution example of an apparatus described in this embodiment mode.

The apparatus shown in FIG. 7 has a first chamber 1111, a second chamber 1112, a third chamber 1113, load lock chambers 1110 and 1115, and a common chamber 1120. Each chamber has airtightness and is provided with a vacuum evacuation pump and an inert gas introduction system.

The load lock chambers 1110 and 1115 are chambers for transferring a sample (a substrate to be processed) to a system. The first to third chambers 1111, 1112, and 1113 are chambers to perform etching, plasma treatment, or the like to a substrate 100. The common chamber 1120 is provided for the sample in common for the load lock chambers 1110 and 1115 and the first to third chambers. In addition, each of gate valves 1122 to 1126 are provided between the common chamber 1120 and the load lock chambers 1110 and 1115, and between the common chamber 1120 and the first to third chambers 1111 to 1113, respectively. It is to be noted that a robot arm 1121 is provided in the common chamber 1120, which transfers a substrate to be processed to each chamber.

As a specific example of forming a gate electrode 108 with an oxide surface by forming a conductive film 105 in the first chamber 1111, removing a resist 106 in the second chamber 1112, and oxidizing a surface of the gate electrode 107 in the third chamber 1113.

First, a cassette 1128 including a plurality of the substrates 100 is transferred to the load lock chamber 1110. After the cassette 1128 is transferred therein, a door of the load lock chamber 1110 is closed. After that, the gate valve 1122 is opened to take out one substrate to be processed from the cassette 1128, and then the substrate is disposed in the common chamber 1120 by the robot arm 1121. Alignment of the substrate 100 is performed in the common chamber 1120 at this time.

Then, the gate valve 1122 is closed and the gate valve 1124 is opened to transfer the substrate 1100 to the first chamber 1111. The gate electrode 107 is formed over the substrate 1100 by etching the conductive film over the substrate 1100 in the first chamber 1111.

Thereafter, the substrate 100 is taken out to the common chamber 1120 by the robot arm 1121 and transferred to the second chamber 1112. In the second chamber 1112, plasma treatment is conducted to the resist 106, thereby the resist 106 is removed.

Then, the substrate 100 is taken out to the common chamber 1120 by the robot arm 1121 and transferred to the third chamber 1113. In the third chamber 1113, the surface of the gate electrode 107 is oxidized using high-density plasma as Embodiment Mode 1, thereby the gate electrode 108 with an oxide film over the surface thereof is formed.

After forming an oxide film as described above, the substrate 100 is transferred to the load lock chamber 1115 by the robot arm 1121 to be stored in the cassette 1129.

It is to be noted that FIG. 7 illustrates only an example. For example, the number of chambers may be increased to form a conductive film or an insulating film. That is, the steps and materials described in the foregoing embodiment modes can be freely combined with the apparatus shown in FIG. 7. In addition, although a single type chamber is employed for the first to third chambers 1111 to 1113 in FIG. 7, a plurality of substrates may be treated all at once by employing a batch chamber.

By using the apparatus described in this embodiment mode, a step of etching a conductive film through a step of oxidizing a surface of a gate electrode can be continuously performed without being exposed to an atmosphere. Therefore, a contaminant can be prevented from being mixed and manufacturing efficiency can be improved.

Embodiment Mode 5

In this embodiment mode, a method for manufacturing an ID chip (note that an ID chip is referred to as a semiconductor device, a wireless chip, and an IC tag in this specification) according the present invention is described. Here, an ID chip is manufactured by using the thin film transistor manufactured in Embodiment Mode 3. In this embodiment mode, the same reference numerals are used for the same portions as in Embodiment Modes 1 to 4, and a detailed description is omitted.

A thin film integrated circuit 702 shown in FIGS. 8A to 8D is formed. An element group including a plurality of n-channel thin film transistors and a plurality of p-channel thin film transistors, and a plurality of the conductive layers 703 and 704 serving as wirings or the like are collectively referred to as a thin film integrated circuit 702. In a manufacturing method of the thin film integrated circuit 702, an insulating layer 701 is formed so as to cover the wiring 454 formed in Embodiment Mode 3 (FIG. 6F). The insulating layer 701 is formed of a single layer or a stacked layer by using an inorganic material or an organic material. The insulating layer 701 is a thin film formed to reduce projections/depressions due to a thin film transistor for planarization. Therefore, the insulating layer 701 is preferably formed by using an organic material.

The conductive layers 703 and 704 which serve as the wirings or the like are formed by etching the insulating layer 701 with photolithography to form a contact hole which exposes the wiring 454 serving as a source electrode or a drain electrode, and then, forming a conductive layer so as to fill the contact hole, and pattern processing the conductive layer. The conductive layers 703 and 704 are formed of a single layer or a stacked layer using an element selected from aluminum (Al), titanium (Ti), silver (Ag) and copper (Cu), and an alloy material or compound material containing any of the elements as its main component. For example, a stacked layer structure of a barrier layer and an aluminum layer; a stacked layer structure of a barrier layer, an aluminum layer, and a barrier layer; or the like may be used. The barrier layer represents titanium, titanium nitride, molybdenum, molybdenum nitride, or the like. It is to be noted that although the n-channel thin film transistor and the p-channel thin film transistor have a structure described in Embodiment Mode 1, the structure is not limited thereto. In addition, the conductive layers 703 and 704 serve as antennas.

Figure 8A:
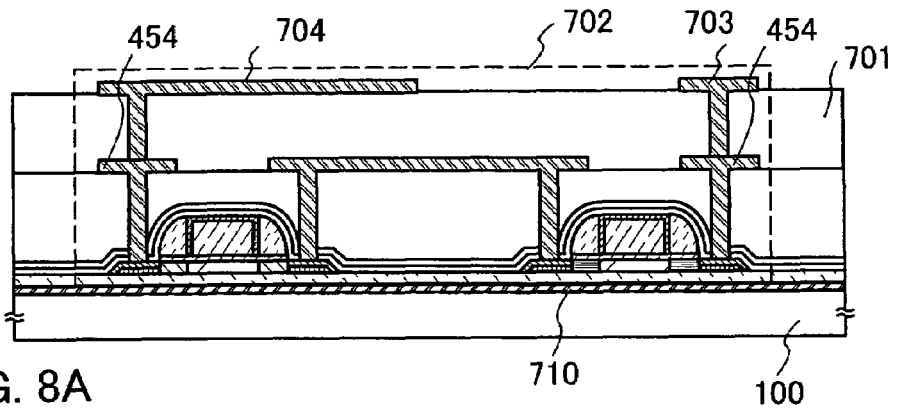
FIGS. 8A to 8D are cross-sectional views for showing a manufacturing process of a semiconductor device of the present invention.

In this embodiment mode, in the thin film integrated circuit 702, a separation layer 710 is formed over one surface of the substrate 100 to separate the substrate 100 in a subsequent step (FIG. 8A). In this embodiment mode, the separation layer 710 is formed over the entire surface of the substrate 100; however, the separation layer can also be provided selectively by etching after forming the separation layer over the entire surface of the substrate 100. When the separation layer is selectively provided, there is an advantage that it takes shorter time to remove the separation layer by etching in a subsequent step.

The separation layer 710 is formed by a known method (such as sputtering or plasma CVD) by using a single layer or a stacked layer of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), iridium (Ir) and silicon (Si), and an alloy material or a compound material containing any of the elements as its main component. A layer containing silicon may have any of an amorphous structure, a microcrystalline structure, and a polycrystalline structure.

When the separation layer 710 has a single layer structure, the separation layer 710 is preferably formed by using a tungsten layer, a molybdenum layer, or a layer containing a mixture of tungsten and molybdenum. Alternatively, the separation layer 710 is formed by using a layer containing oxide or oxynitride of tungsten, a layer containing oxide or oxynitride of molybdenum, or a layer containing oxide or oxynitride of a mixture of tungsten and molybdenum. It is to be noted that the mixture of tungsten and molybdenum represents, for example, an alloy of tungsten and molybdenum. In addition, oxide of tungsten may be referred to as tungsten oxide.

When the separation layer 710 has a stacked layer structure, a first layer thereof formed over the substrate 100 is preferably a tungsten layer, a molybdenum layer, or a layer containing a mixture of tungsten and molybdenum. As a second layer thereof, a layer containing tungsten; molybdenum; or oxide, nitride, oxynitride or nitride oxide of a mixture of tungsten and molybdenum is formed.

When the separation layer 710 has a stacked layer structure of a layer containing tungsten and a layer containing tungsten oxide over the layer containing tungsten, the layer containing tungsten may be formed first and a layer containing silicon oxide may be formed thereover so that a layer containing tungsten oxide may be formed in an interface between the tungsten layer and the silicon oxide layer. Similarly, in the case where a layer containing tungsten nitride, a layer containing tungsten oxynitride, or a layer containing tungsten nitride oxide is formed as the second layer, a layer containing silicon nitride, a layer containing silicon oxide containing nitrogen, or a layer containing silicon nitride containing oxygen may be respectively formed over the first layer containing tungsten.

Tungsten oxide is represented by $WO_x$, where x is 2 to 3. For example, there are cases that x is 2 ($WO_2$), x is 2.5 ($W_2O_5$); x is 2.75 ($W_4O_{11}$); x is 3 ($WO_3$); and the like. In forming tungsten oxide, the value of x is not specifically limited, and it may be determined based on its etching rate or the like. It is to be noted that a layer containing tungsten oxide ($WO_x$, 0<x<3), which is formed by sputtering in an oxygen atmosphere, has the best etching rate. Thus, in order to shorten the manufacturing time, the separation layer is preferably formed by using a layer containing tungsten oxide that is formed by a sputtering method in an oxygen atmosphere.

The separation layer 710 may be formed so as to be in contact with the substrate 100. Alternatively, after an insulating layer is formed as a base so as to be in contact with the substrate 100, the separation layer 710 may be formed so as to be in contact with the insulating layer.

Although not shown here, a protective layer may be formed so as to cover the thin film integrated circuit 702 by a known method. The protective layer represents a layer containing carbon such as DLC (diamond like carbon), a layer containing silicon nitride, a layer containing silicon nitride oxide, or the like.

Figure 8B:
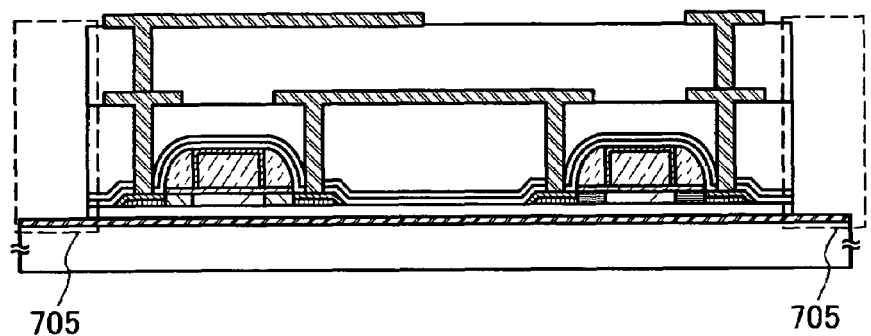

Then, a base film and an interlayer insulating film are etched by a photolithography method so as to expose the separation layer 710 to form an opening 705 (FIG. 8B).

Figure 8C:
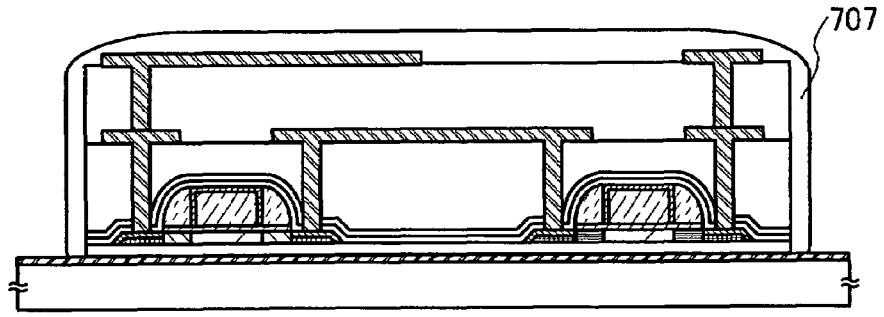

Then, an insulating layer 707 is formed so as to cover the thin film integrated circuit 702 (FIG. 8C). The insulating layer 707 is formed by using an organic material, preferably an epoxy resin. The insulating layer 707 is formed to prevent scattering of the thin film integrated circuit 702. Since the thin film integrated circuit 702 is not tightly attached to the substrate after removing the separation layer, and is small and lightweight, the thin film integrated circuit 702 is easily scattered. By forming the insulating layer 707 in the periphery of the thin film integrated circuit 702, the weight of the thin film integrated circuit 702 can be increased, and thus, scattering thereof from the substrate 100 can be prevented. In addition, the thin film integrated circuit 702 is thin and lightweight; however, by forming the insulating layer 707, the thin film integrated circuit 702 is hardly rolled and can have a certain degree of strength. It is to be noted that, in the shown structure, the insulating layer 707 is formed over the top surface and the side surfaces of the thin film integrated circuit 702; however, the present invention is not limited to this structure, and the insulating layer 707 may be formed only over the top surface of the thin film integrated circuit 702. In addition, in the above description, after forming the opening 705 by etching the base film and the insulating film, the insulating layer 707 is formed; however, the present invention is not limited to this order. For example, after the step of forming the insulating layer 707 over the insulating layer 701, the openings may be formed by etching the plurality of the insulating layers. With this order of the steps, the insulating layer 707 is formed only over the top surface of the thin film integrated circuit 702.

Figure 8D:
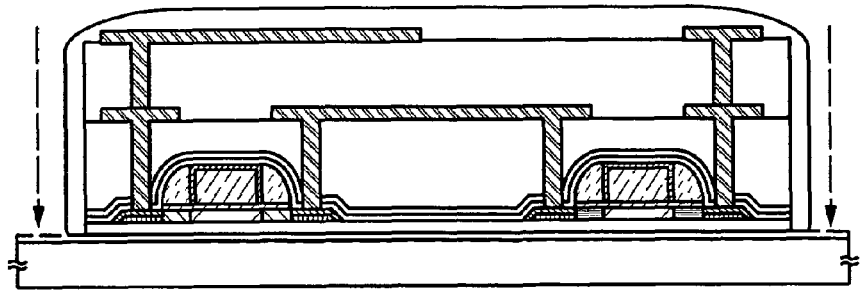

Then, an etching agent is added to the opening 705 to remove the separation layer 710 (FIG. 8D). As the etching agent, a gas or liquid containing halogen fluoride or a halogen compound is used. For example, chlorine trifluoride is used as the gas containing halogen fluoride. Thus, the thin film integrated circuit 702 is separated from the substrate 100.

Figure 9A:
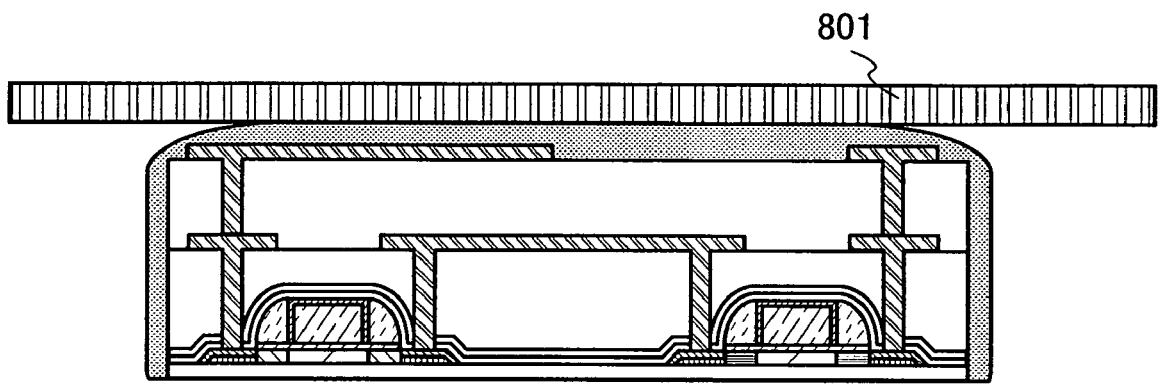
FIGS. 9A and 9B are cross-sectional views for showing a manufacturing process of a semiconductor device of the present invention.

Then, one surface of the thin film integrated circuit 702 is attached to a first base 801 (FIG. 9A). It is to be noted that before removing the separation layer 710, one surface of the thin film integrated circuit 702 may be attached to the first base 801. Subsequently, the opposite surface of the thin film integrated circuit 702 is attached to a second base 802 after removing the thin film integrated circuit 702 from the substrate 100. The thin film integrated circuit 702 may be attached to the first base 801 and the second base 802 via a material having adhesion such as an adhesive. Alternatively, a device such a magnet or a device for vacuum suction may be used.

Figure 9B:
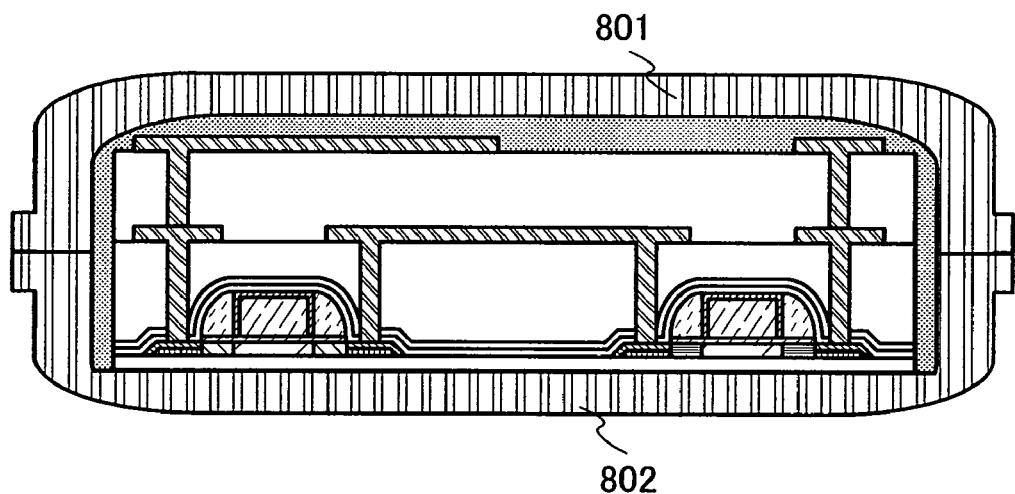

Then, the first base 801 and the second base 802 are attached to each other so that the thin film integrated circuit 702 is sealed by the first base 801 and the second base 802 (FIG. 9B). Thus, an ID chip in which the thin film integrated circuit 702 is sealed by the first base 801 and the second base 802 is manufactured.

A film formed from a resin material is used as the first base 801 and the second base 802. In particular, a film provided with a layer which is dissolved in thermocompression bonding (also referred to as a thermal flexible resin) may be preferably used as the first base 801 and the second base 802. Then, either of the first base 801 or the second base 802 is dissolved by heat treatment, and the dissolved base is attached to the other base by heating, so that the thin film integrated circuit can be sealed. The bases may be attached to each other via a material having adhesion such as an adhesive. Alternatively, a device such a magnet or a device for vacuum suction may be used. In addition the bases may be attached to each other by melting an adhesive layer formed over the surface by heat treatment.

The thermal flexible resin used for the first and the second bases preferably has a low softening point. For example, a polyolefin based resin such as polyethylene, polypropylene, or polymethylpentene; a vinyl based copolymer such as vinyl chloride, vinyl acetate, a vinyl chloride-vinyl acetate copolymer, an ethylene-vinyl acetate copolymer, vinylidene chloride, polyvinyl butyral, or polyvinyl alcohol; an acrylic based resin; a polyester based resin; an urethane based resin; a cellulose based resin such as cellulose, cellulose acetate, cellulose acetate butyrate, cellulose acetate propionate, or ethyl cellulose; or a styrene based resin such as polystyrene or a acrylonitrile-styrene copolymer can be used. A film having a single layer or a plurality of layers of the thermal flexible resin is used for the first base 801 and the second base 802. A film provided with a plurality of layers of the thermal flexible resin has, for example, a structure in which a base containing a first thermal flexible resin is provided with an adhesive layer containing a second thermal flexible resin having a lower softening point than that of the first thermal flexible resin can be given. A stacked layer structure of two or more layers may also be employed. In addition, a biodegradable thermal flexible resin may also be used.

In this embodiment mode, although a method for forming one ID chip is described with reference to FIGS. 8A to 8D and 9A and 9B, a plurality of ID chips are formed with one substrate in fact.

By the foregoing steps, a flexible ID chip is manufactured. An ID chip formed according to this embodiment mode is extremely fine and has flexibility, so that the ID chip can be placed at any place and can be used for various purposes. In addition a high-performance ID chip can be realized.

Then, a method for manufacturing an ID chip with a different method from that of described above.

First, the thin film integrated circuit 702 is formed by the same method as described above. It is to be noted that an element group including a plurality of n-channel thin film transistors and a plurality of p-channel thin film transistors, and a plurality of the conductive layers 703 and 704 serving as wirings or the like are collectively referred to as the thin film integrated circuit 702.

Figure 19A:
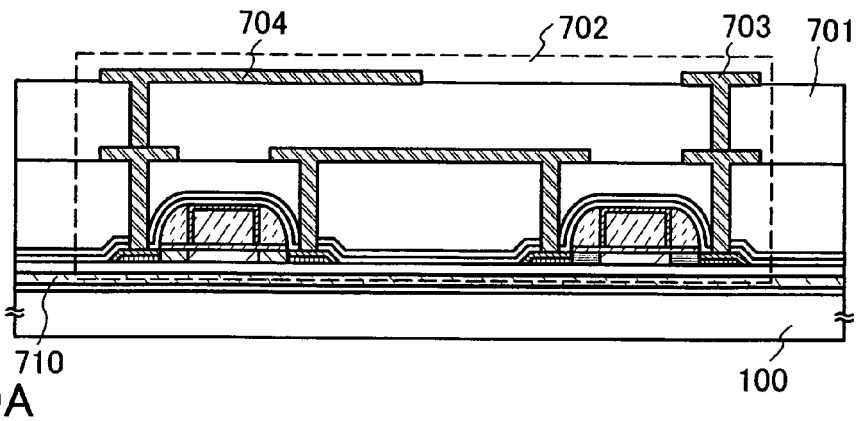
FIGS. 19A to 19D are views for showing a manufacturing process of a semiconductor device of the present invention.
Figure 19B:
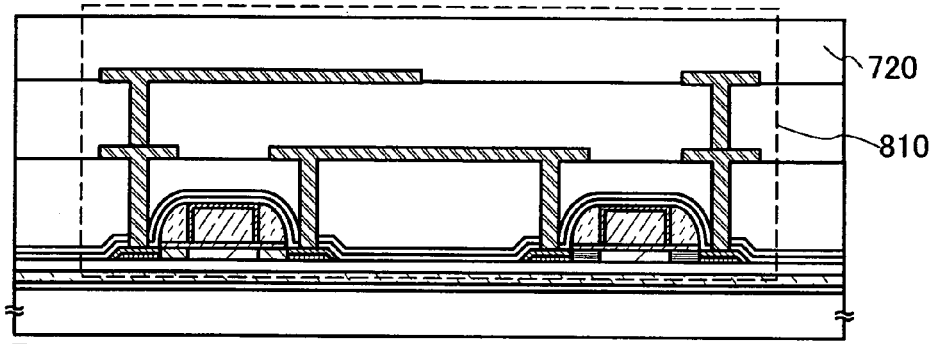

In this embodiment mode, in the thin film integrated circuit 702, a separation layer 710 is formed over one surface of the substrate 100 to separate the substrate 100 in a subsequent step (FIG. 19A). The separation layer 710 may be formed so as to be in contact with the substrate 100. Alternatively, after an insulating layer is formed as a base so as to be in contact with the substrate 100, the separation layer 710 may be formed so as to be in contact with the insulating layer.

Next, the insulating layer 720 is formed so as to cover the thin film integrated circuit 702. The insulating layer 720 is formed by a screen printing method or the like. Since the insulating layer 720 serves as a protective layer in a subsequent separating step, the insulating layer is preferably a planarized layer. Thus, a layer 810 including a thin film integrated circuit is formed.

Figure 19C:
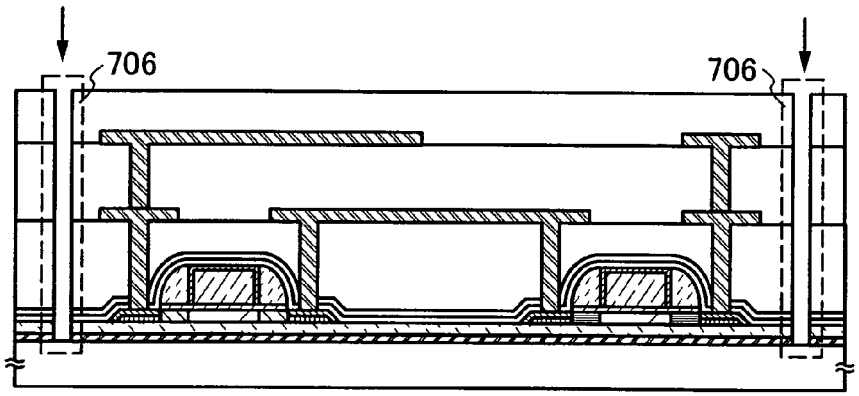

Then, an opening 706 is formed to expose at least a part of the separation layer 710 (FIG. 19C). The step is preferably conducted by laser beam irradiation since the treatment time is short. Laser beam is irradiated from the surface of the insulating layer 720. The opening 706 is formed to expose at least a part of the separation layer 710. It is to be noted that the laser beam may reach the substrate 100.

A solid laser having a wavelength of 150 to 380 nm which is in ultraviolet region can be used. Preferably, a Nd:YVO$_4$ laser having a wavelength of 150 to 380 nm is used since light of which is easier to be absorbed by the substrate compared with other lasers having higher wavelengths, and an ablation process can be conducted. In addition, a Nd:YVO$_4$ laser having a wavelength of 150 to 380 nm has a preferable property to be processed and does not effect a periphery of a processed portion.

Figure 19D:
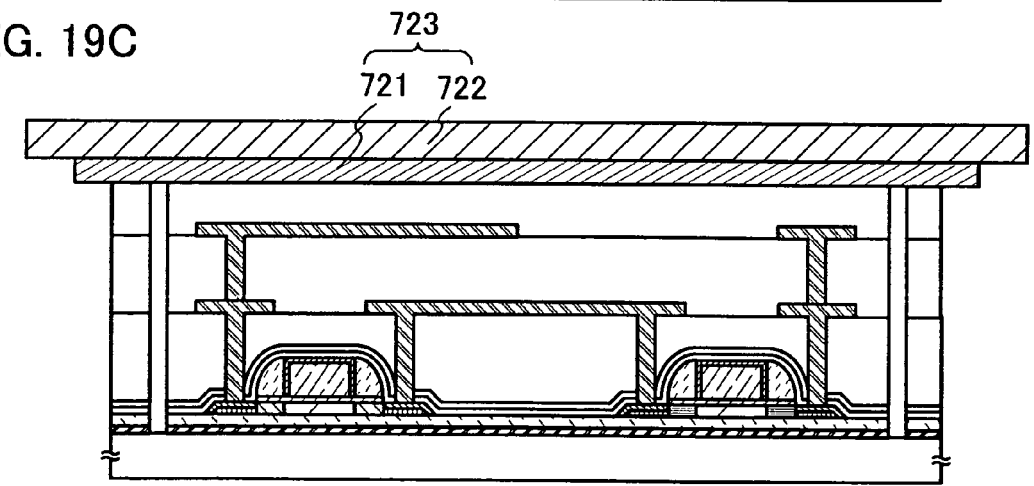

Next, a substrate 723 is formed over the insulating layer 701 (FIG. 19D). The substrate 723 is a heat peelable substrate in which an insulating layer 722 and an adhesive layer 721 are stacked. The adhesive layer 721 is a layer which has an adhesion deteriorated with heat treatment. For example, a layer having a material containing a thermal flexible adhesive which is softened when heated, a layer formed from a material containing a microcapsule or a blowing agent which are expand when heated, a layer formed from a material of a thermosetting resin with a thermofusion property and a pyrolytic property, a layer whose interface intensity is deteriorated due to penetration of water, or a layer containing a water absorption resin which expands with water can be used.

Figure 20A:
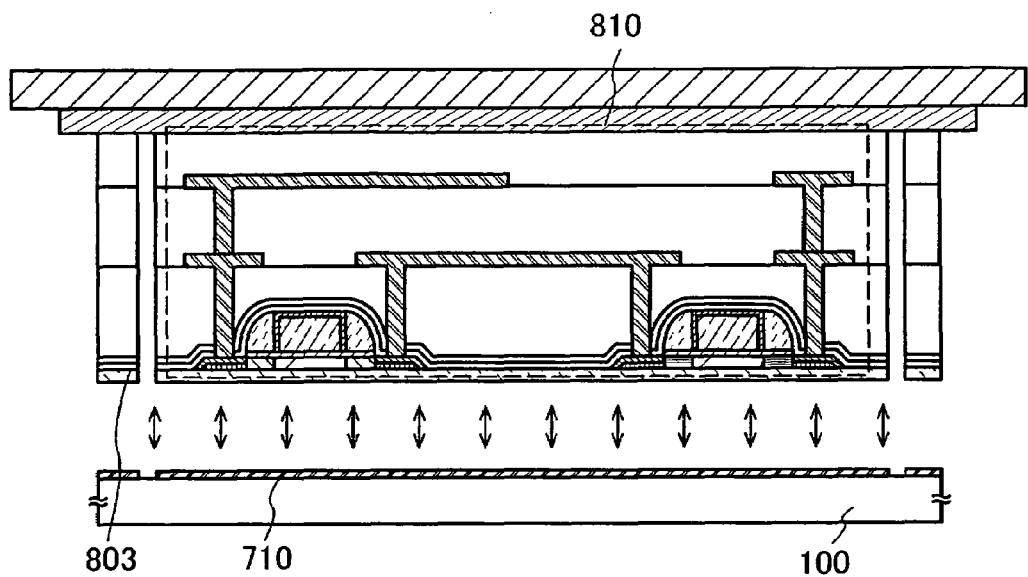
FIGS. 20A to 20C are views for showing a manufacturing process of a semiconductor device of the present invention.

Then, the layer 810 including the thin film integrated circuit is separated from the substrate 100 using the substrate 723 (FIG. 20A). Separation of the layer 810 including the thin film integrated circuit from the substrate 100 is conducted inside the separation layer 710 or in an interface between the separation layer 710 and the insulating layer 803. A case where the separation is conducted with an interface between the separation layer 710 and the insulating layer 803 is shown. Thus, by using the substrate 723, a step of separation can be conducted easier and within a short time.

Figure 20B:
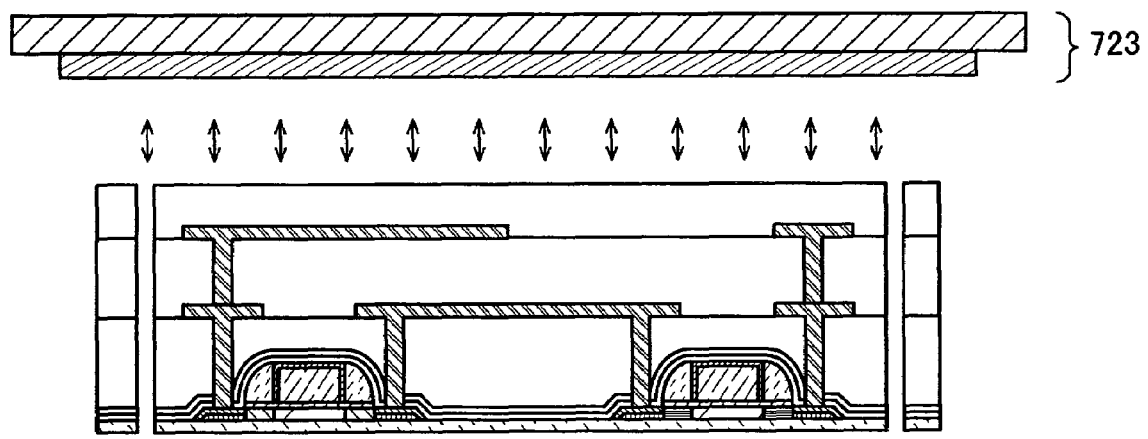

Then heat treatment is conducted to separate the layer 810 including the thin film integrated circuit from the substrate 723 (FIG. 20B). It is to bee noted that although not shown, a substrate in which an insulating layer and an adhesive layer are stacked may be formed over the surface of the insulating layer 803. The adhesive layer used here is a layer with an adhesion increased with heat treatment which corresponds to a layer containing a thermal flexible resin. A thermal flexible resin is, for example, polyethylene, polystyrene, polypropylene, polyvinyl chloride or the like.

As described above, the substrate 723 is a heat peelable substrate. Therefore, adhesion between the substrate 723 and the insulating layer 720 is deteriorated and the layer 810 including the thin film integrated circuit is separated from the substrate 723.

Then, one surface of the layer 810 including the thin film integrated circuit is attached to the first base 801. Alternatively, before removing the separation layer 710, one surface of the layer 810 including the thin film integrated circuit may be attached to the first base 801. The opposite surface of the layer 810 including the thin film integrated circuit is attached to the second base 802 after separating the layer 810 including the thin film integrated circuit from the substrate 100. It is to be noted that the layer 810 including the thin film integrated circuit may be attached to the first base 801 and the second base 802 via a material having adhesion such as an adhesive. Alternatively, a device such a magnet or a device for vacuum suction may be used. Further alternatively, the layer 810 including the thin film integrated circuit may be attached to the first base 801 and the second base 802 by melting an adhesive layer formed over the surface by heat treatment.

Figure 20C:
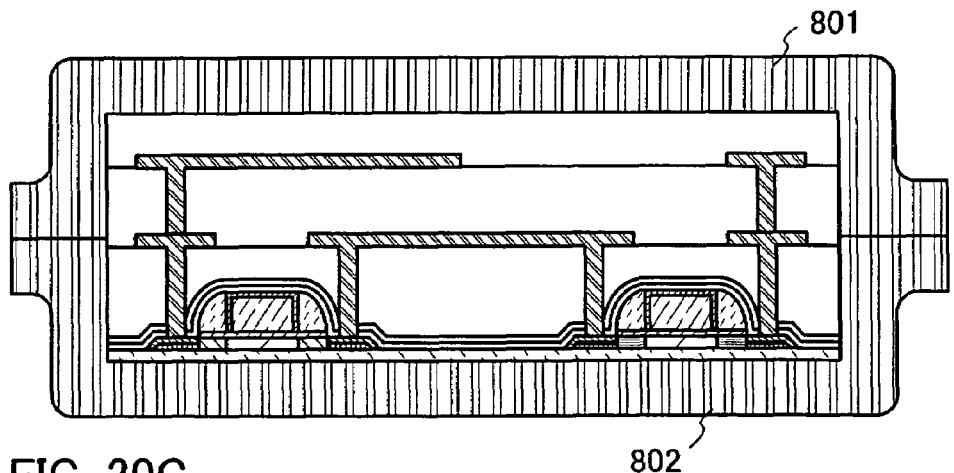

Then, the first base 801 and the second base 802 are attached to each other so that the layer 810 including the thin film integrated circuit is sealed by the first base 801 and the second base 802 (FIG. 20C). Thus, an ID chip in which the layer 810 including the thin film integrated circuit is sealed by the first base 801 and the second base 802 is manufactured. It is to be noted that strength of the ID chip is improved by using the first base 801 and the second base 802.

As a separation method, a method of etching a separation layer containing tungsten or a method of separating the separation layer using laser light absorbed in the separation layer is employed here, however, another separation method may also be used. Another known separation method can also be employed in this embodiment mode. For example, a method for separating the substrate 100 by applying a physical impact to the separation layer can be used. Further, a method for removing the substrate 100 in which the substrate 100 itself is ground without providing the separation layer can also be used.

Figure 10A:
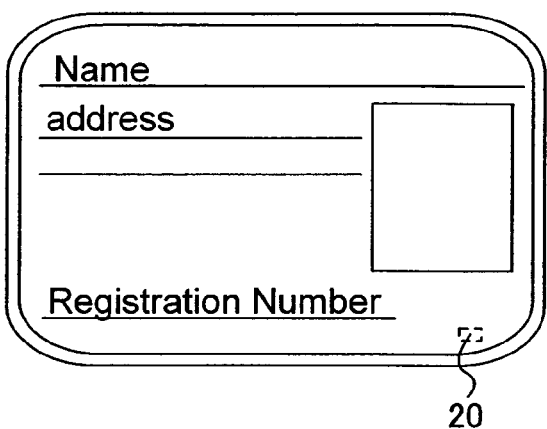
FIGS. 10A to 10E show semiconductor devices of the present invention.
Figure 10B:
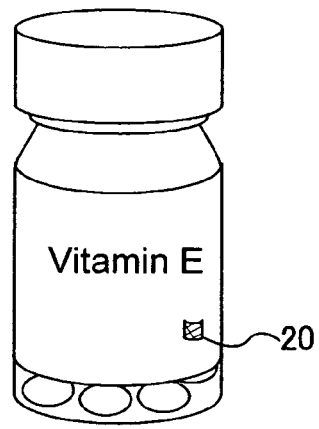
Figure 10C:
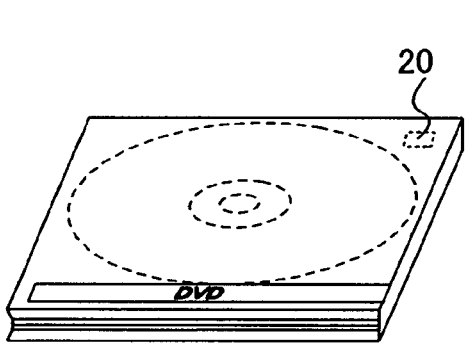
Figure 10D:
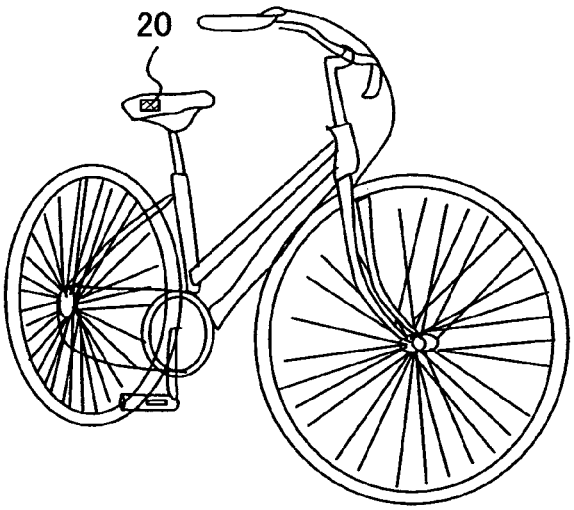
Figure 10E:
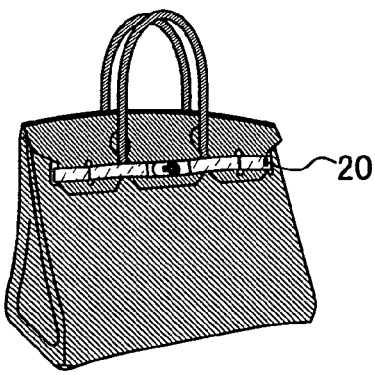

The ID chip manufactured in the present invention can be used broadly, and may be used by being mounted in objects such as, for example, bills, coins, securities, bearer bonds, certificates (drivers licenses, resident cards and the like, see FIG. 10A), containers for wrapping objects (wrapping paper, bottles and the like, see FIG. 10B), recording media (DVDs, video tapes and the like, refer to FIG. 10C), vehicles (bicycles and the like, see FIG. 10D), personal belongings (bags, glasses and the like, see FIG. 10E), foods, clothes, living ware, and electric appliances. The electric appliances include a liquid crystal display device, an EL display device, a television unit (also simply referred to as a TV, a TV receiver or a television receiver), a cellular phone, and the like. Reference numeral 20 denotes an ID chip manufactured in this embodiment mode.

The ID chip is attached to the surface of the objects, or incorporated to be fixed in the objects. For example, it may be incorporated in paper of a book, or an organic resin of a package to be fixed in each object. By providing the ID chip in bills, coins, securities, bearer bonds, certificates, and the like, forgery thereof can be prevented. Further, by providing the ID chip (a wireless chip) in containers for wrapping objects, recording media, personal belongings, foods, clothes, living ware, electric appliances, and the like, an inspection system or a system in a rental shop can be more effective. In addition, by providing the ID chip in vehicles, forgery or theft can be prevented.

Embodiment Mode 6

In this embodiment mode, an example of manufacturing a CPU (Central Processing Unit) according to the present invention is described. Herein, the CPU is manufactured by using the thin film transistor manufactured in Embodiment Mode 5. Further, in this embodiment mode, the same reference numerals are used for the same portions as in Embodiment Modes 1 to 5, and a detailed description is omitted.

A thin film transistor integrated circuit having a structure shown in FIG. 19A in Embodiment Mode 5 is formed by the same method as that of Embodiment Mode 5. However, the structure is not limited thereto, and a thin film integrated circuit having a structure other than shown in FIG. 19A can be formed using a gate electrode of the present invention, and a thin film integrated circuit appropriate for characteristics of each circuit forming a CPU can be formed.

When the completed CPU is desired to be flexible and more lightweight, a substrate 100 may be separated, and the CPU may be attached to another lightweight substrate having flexibility.

As the method of separating the substrate 100, a method in which the substrate 100 is physically ground and removed, or a method in which the separation layer 710 is provided between the substrate 100 and the semiconductor film in advance as shown in Embodiment Mode 5 and the separation layer is removed or softened to separate the substrate 100 can be given. In addition, a method in which the substrate 100 is separated by applying a physical impact to the separation layer, or a method in which laser light is absorbed in the separation layer to separate the substrate 100 can be given. After the substrate 100 is separated by any of the above methods, a lightweight flexible substrate (not shown) is attached to the thin film integrated circuit 702. A lightweight flexible CPU can also be formed by foregoing methods.

As described above, by using the thin film transistor of the present invention, a semiconductor device such as a CPU can be manufactured. Since a CPU formed by using the thin film transistor of the present invention is lightweight and small, it can be carried about or mounted with fewer loads. In addition, a CPU capable of a high-speed operation can be manufactured.

Further, a specific structure of the CPU of this embodiment mode is described with reference to a block diagram.

Figure 11:
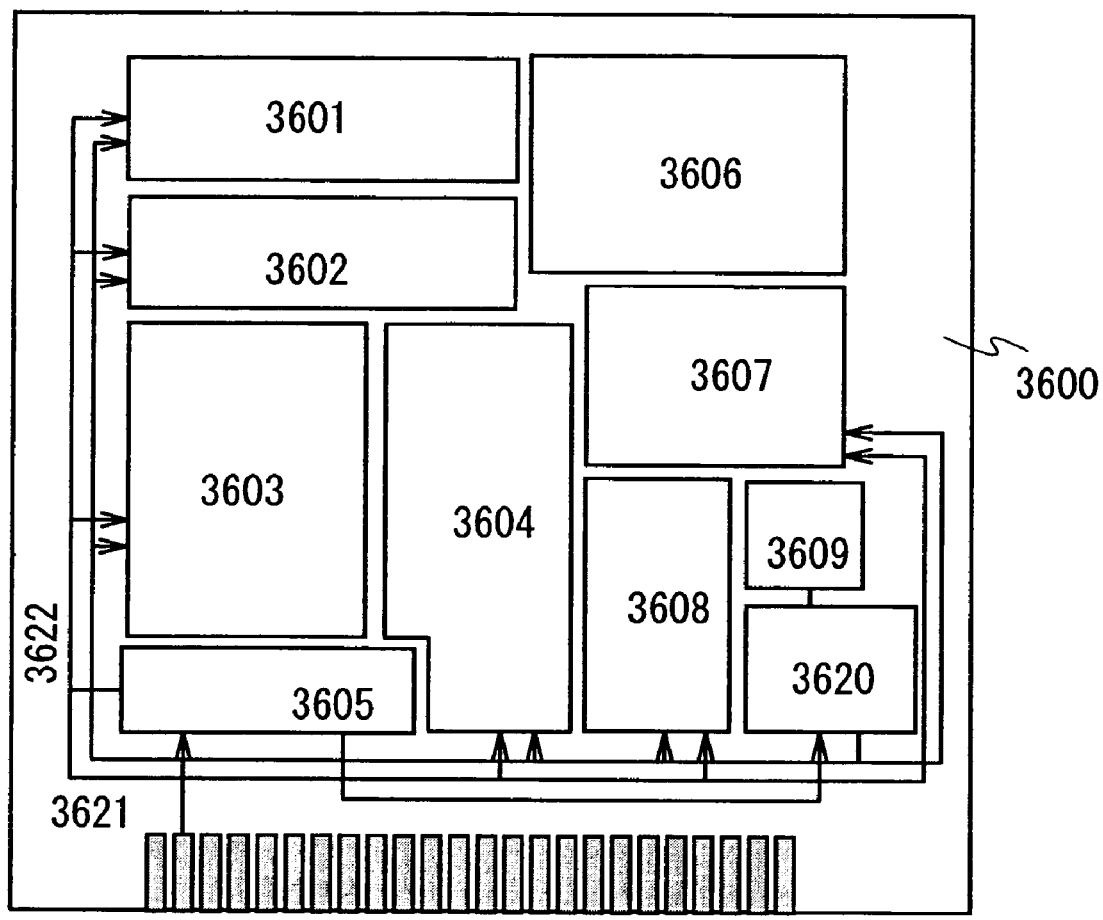
FIG. 11 is a block diagram of a CPU using a semiconductor device of the present invention.

A CPU shown in FIG. 11 mainly includes an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, a rewritable ROM 3609 and a ROM interface (ROM I/F) 3620, over a substrate 3600. The ROM 3609 and the ROM interface 3620 may be provided over another chip as well. These various circuits forming the CPU are formed by a plurality of thin film integrated circuits 702.

Obviously, the CPU shown in FIG. 11 is only an example of a structure which is simplified, and an actual CPU may have various structures depending on the application.

An instruction inputted to the CPU through the bus interface 3608 is inputted to the instruction decoder 3603 and decoded therein, and then, inputted to the ALU controller 3602, the interrupt controller 3604, the register controller 3607, and the timing controller 3605.

The ALU controller 3602, the interrupt controller 3604, the register controller 3607, and the timing controller 3605 conduct various control based on the decoded instruction. Specifically, the ALU controller 3602 generates signals to control the drive of the ALU 3601. While the CPU is executing a program, the interrupt controller 3604 determines an interrupt request from an external input/output device or a peripheral circuit based on its priority or a mask state, and processes the request. The register controller 3607 generates an address of the register 3606, and reads/writes data from/to the register 3606 in accordance with the state of the CPU.

The timing controller 3605 generates signals to control a drive timing of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the clock signal CLK2 to the various foregoing circuits.

Embodiment Mode 7

In this embodiment mode, a method for manufacturing a display device by using thin film transistors having various structures described in Embodiment Modes 1 to 3 is described with reference to FIG. 12. The method for manufacturing a display device described in this embodiment mode is a method for manufacturing thin film transistors of a pixel portion and its peripheral driver circuit portion concurrently. In this embodiment mode, the same reference numerals are used for the same portions as in Embodiment Modes 1 to 6, and a detailed description is omitted.

A plurality of transistors of the present invention is formed by the method in Embodiment Mode 3. Then, a passivation film 1001 is formed to have a thickness of 50 to 500 nm (typically, 200 to 300 nm) as a protective film. The passivation film can be substituted with a silicon oxide film, a silicon nitride film, a silicon nitride oxide film, or a stacked layer of these films. Blocking effect of preventing penetration of various ionic impurities, which includes oxygen or moisture in an atmosphere can be obtained by providing the passivation film 1001.

Then, an interlayer insulating film 1002 is formed to have a film thickness of 1.6 μm over the passivation film 1001. The interlayer insulating film 1002 can be formed of an organic resin film such as polyimide, polyamide, BCB (benzocyclobutene), acrylic, or siloxane by an SOG (Spin On Glass) method or a spin coating method; an inorganic interlayer insulating film (an insulating film containing silicon such as silicon nitride or silicon oxide); a film formed from a low-k (low dielectric constant) material; or the like. The interlayer insulating film 1002 is preferably a film superior in planarity because the interlayer insulating film 1002 relieves a ridge caused by a thin film transistor formed over the glass substrate and thus has great significance of planarity. Thereafter, another passivation film may be further formed over the interlayer insulating film. It is to be noted that siloxane has a skeleton structure formed by the bond of silicon (Si) and oxygen (O), in which an organic group at least containing hydrogen (such as an alkyl group or aromatic hydrocarbon) is included as a substituent. An organic group at least containing hydrogen or a fluoro group may be alternatively used as a substituent Then, a contact hole is formed in the passivation film 1001 and the interlayer insulating film 1002, and then source and drain wirings 1003a to 1003i are formed. In this embodiment mode, each of the source and drain wirings has a three-layer structure of a titanium film, a first aluminum film, and a second aluminum film containing carbon and a metal element or a three-layer structure of a molybdenum film, a first aluminum film, and a second aluminum film containing carbon and a metal element. The first aluminum film may be a film containing another metal element. As an example of the metal element contained in the second aluminum film, titanium, molybdenum, or nickel is given. It is to be noted that other metals may be used for the source and drain wirings instead of the above metals.

Figure 12:
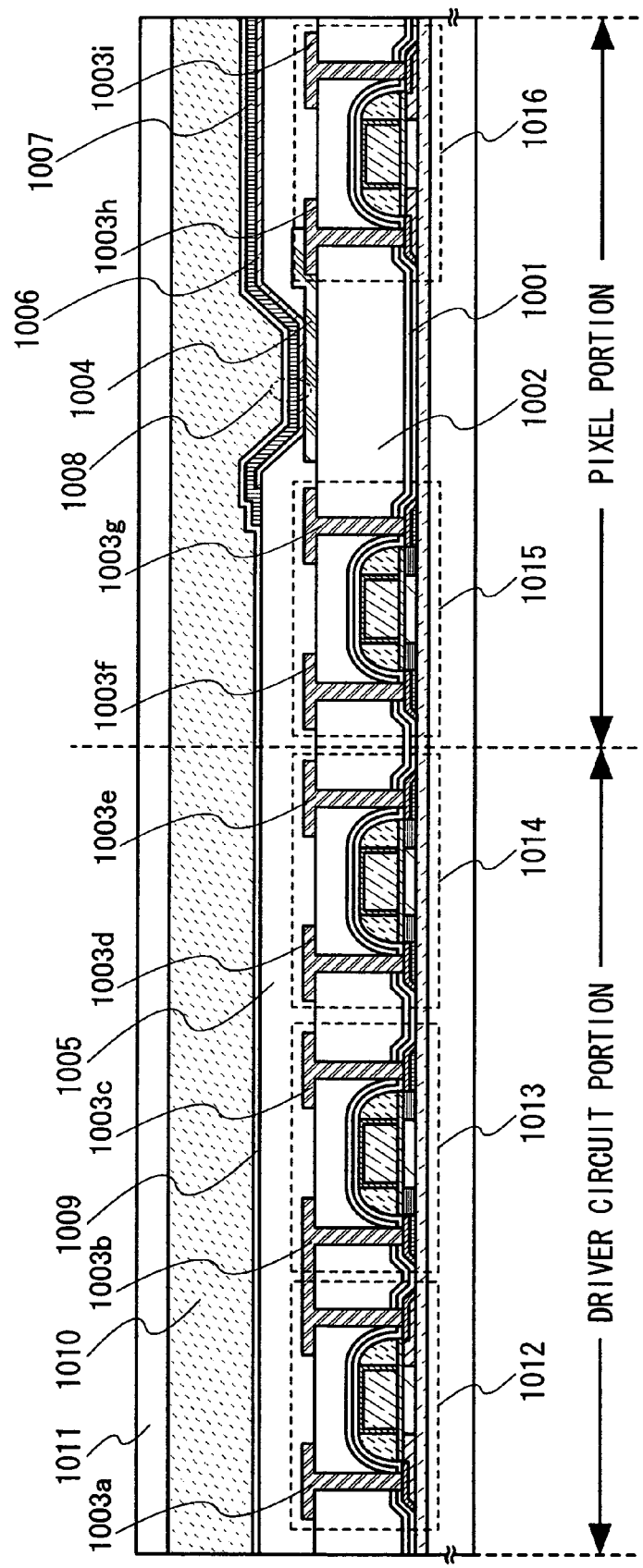
FIG. 12 is a cross-sectional view for showing a manufacturing process of a display device of the present invention.

Subsequently, a pixel electrode 1004 is formed so as to be in contact with the drain wiring 1003h (FIG. 12). The pixel electrode 1004 is formed by etching a transparent conductive film. As the transparent conductive film can be a compound of indium oxide and tin oxide, a compound of indium oxide and zinc oxide, zinc oxide, tin oxide, or indium oxide can be used.

When the pixel electrode 1004 is formed of a transparent conductive film and the drain wiring is formed of an aluminum film, aluminum oxide is formed in the interface. Since oxide has high resistance, high resistance is generated between the pixel electrode and the drain wiring. However, in this embodiment mode, the pixel electrode is connected to the first aluminum film via the second aluminum film; therefore, oxide is not formed. This is because the metal element contained in the second aluminum film suppresses oxide to be formed. Accordingly, the resistance in the interface between the drain wiring and the pixel electrode can be kept low.

After forming the pixel electrode, a partition wall 1005 is formed by using a resin material. The partition wall 1005 is formed by etching an acrylic film or a polyimide film having a thickness of 1 to 2 μm so that a part of the pixel electrode 1004 is exposed. It is to be noted that a film formed from a black material to serve as a light-shielding film (not shown) may be provided appropriately below the partition wall 1005.

Then, an EL layer 1006 and an electrode (MgAg electrode) 1007 are formed continuously by a vacuum vapor deposition method without being exposed to an atmosphere. It is preferable to form the EL layer 1006 to have a thickness of 100 nm to 1 μm and to form the electrode 1007 to have a thickness of 180 to 300 nm (typically, 200 to 250 nm). The EL layer may be formed by an ink-jet method, a screen-printing method, or the like as well.

In this step, an EL layer and a cathode are sequentially formed in each pixel of red, green, and blue. It is necessary to form the EL layer individually for each color without using a photolithography technique because the EL layer has low resistance to a solution. Therefore, it is preferable to cover pixels other than the predetermined pixels with a metal mask to form an EL layer and a cathode selectively only in necessary portions. Since the triplet compound has higher luminance than a singlet compound, it is preferable that the triplet compound is used to form a pixel of red that looks dark, and the singlet compound is used to form other pixels. It is to be noted that the present invention is not limited thereto and other pixels can be formed from a triplet compound.

In other words, a mask for covering all pixels other than the pixels of red is set, and an EL layer for red light emission and an electrode are selectively formed using the mask. Next, a mask for covering all pixels other than the pixels of green is set, and an EL layer for green light emission and an electrode are selectively formed using the mask. Then, a mask for covering all pixels other than the pixels of blue is set, and an EL layer for blue light emission and an electrode are selectively formed using the mask. It is to be noted that different masks are used for each color here; however, the same mask may be used plural times. In addition, it is preferable to maintain vacuum until the EL layers and the electrodes are formed in all the pixels.

The EL layer 1006 may be formed by using a known material. It is preferable to use an organic material as the material in consideration of a drive voltage. For example, an EL layer having a four-layer structure of a hole-injecting layer, a hole-transporting layer, a light-emitting layer, and an electron-injecting layer is preferably formed. A film in which molybdenum oxide and α-NPD are mixed may also be used for the EL layer. Alternatively, a hybrid layer in which an organic material and an inorganic material are combined may also be used for the EL layer. In the case of using an organic material for the EL layer, each of a low molecular material, an intermediate molecular material, and a high molecular material can be used. In addition, this embodiment mode shows the example of using the MgAg electrode as a cathode of an EL element; however, other known materials may also be used.

After forming the electrode 1007, a light-emitting element 1008 is completed. Thereafter, a protective film 1009 is provided so as to cover the light-emitting element 1008 completely. The protective film 1009 can be formed by using an insulating film including a carbon film, a silicon nitride film, or a silicon nitride oxide film. Such insulating films can be used as a single layer or a stacked layer.

Further, a sealing material 1010 is provided to cover the protective film 1009, and a cover material 1011 is attached thereto. As the sealing material 1010, an ultraviolet ray curing resin, which preferably contains a hygroscopic substance or an antioxidant substance is used. Furthermore, in this embodiment mode, a glass substrate, a quartz substrate, or a plastic substrate can be used for the cover material 1011. Although not shown, a polarizing plate may be provided between the sealing material 1010 and the cover member 1011. By providing the polarizing plate, high-contrast display can be provided.

Accordingly, as shown in FIG. 12, an active matrix EL display device having a structure including a p-channel thin film transistor 1012, an n-channel thin film transistor 1013, a sampling circuit thin film transistor 1014, a switching thin film transistor 1015, and a current-control thin film transistor 1016 is completed. In this embodiment mode, the p-channel thin film transistor 1012, the current-control thin film transistor 1016, the n-channel thin film transistor 1013, the switching thin film transistor 1015, and the sampling circuit thin film transistor 1014 can be formed concurrently over one substrate.

In this embodiment mode, a bottom-emission EL display device is described, in which a pixel electrode is a transparent conductive film and the other electrode is an MgAg electrode. However, the present invention is not limited to this structure, and a top-emission EL display device may be manufactured by forming a pixel electrode with a light-shielding material and forming the other electrode with a transparent conductive film. In addition, a dual-emission EL display device may be manufactured by forming the both electrodes with a transparent conductive film.

Figure 13:
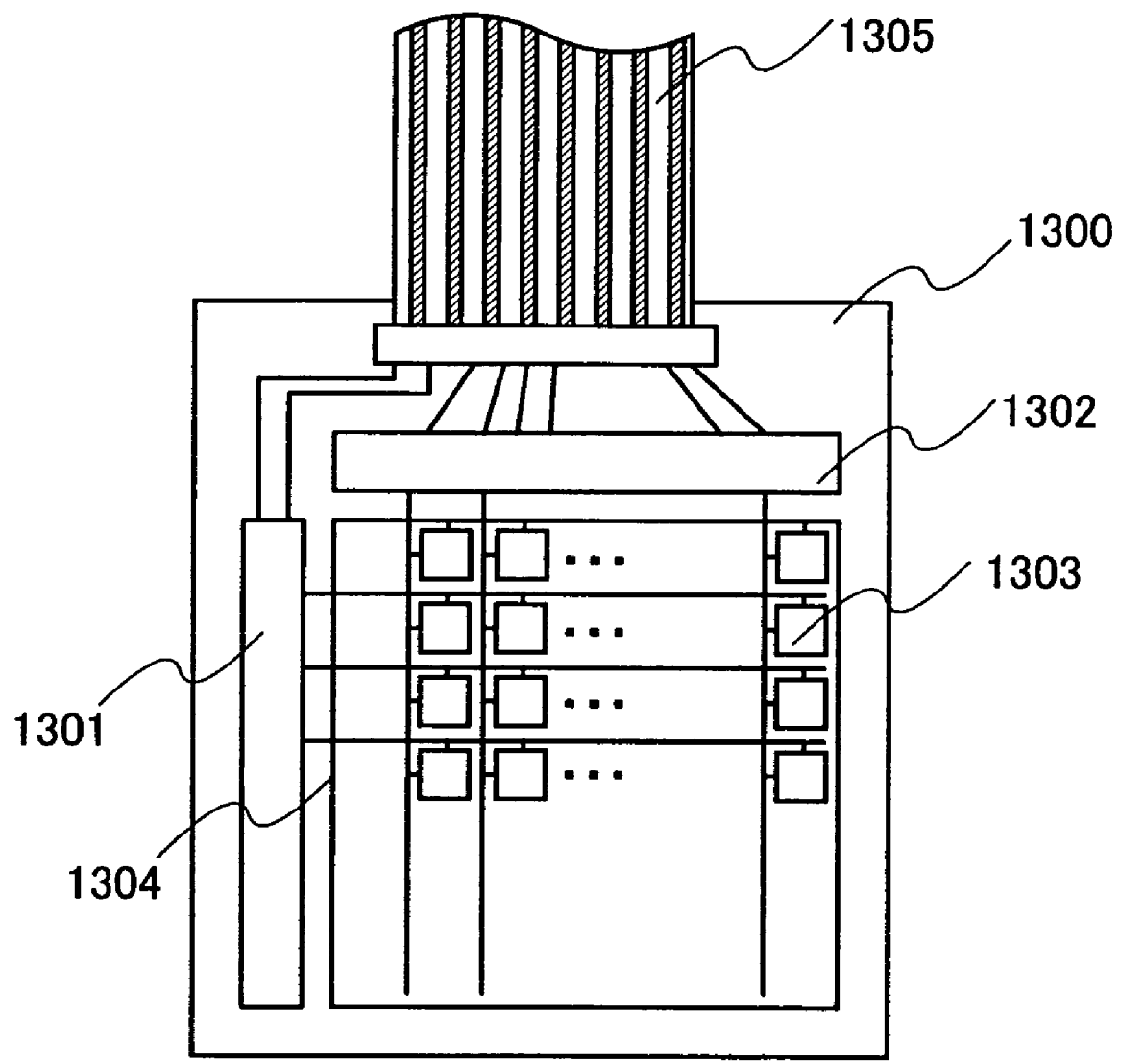
FIG. 13 is a top view for showing a display device of the present invention.

FIG. 13 shows a schematic view of a display device. A gate-signal line driver circuit 1301, a source-signal line driver circuit 1302, and a pixel portion 1304 having a plurality of pixels 1303 are formed over a substrate 1300. The gate-signal line driver circuit 1301 and the source-signal line driver circuit 1302 are connected to an FPC (Flexible Printed Circuit) 1305. The p-channel thin film transistor 1012 and the n-channel thin film transistor 1013 each shown in FIG. 12 can be used for the source-signal line driver circuit or the gate-signal line driver circuit.

The source-signal line driver circuit 1302 includes a shift register circuit, a level shifter circuit, and a sampling circuit. A clock signal (CLK) and a start pulse signal (SP) are inputted into the shift register circuit, which outputs a sampling signal for sampling a video signal. The sampling signal outputted from the shift register is inputted into the level shifter circuit, and the signal is amplified. The amplified sampling signal is then inputted into the sampling circuit. The sampling circuit samples a video signal inputted from outside by the sampling signal and inputs the signal to the pixel portion.

Thus, in a semiconductor device manufactured according to this embodiment mode, high-speed operation and high-performance can be realized. In addition, the manufacturing process can be simplified.

The present invention is not limited to a display device having the above structure and can be applied in manufacturing process of various display devices.

Embodiment Mode 8

In this embodiment mode, an example of a liquid crystal display device according to the present invention is described. In this embodiment mode, the same reference numerals are used for the same portions as in Embodiment Modes 1 to 7, and a detailed description is omitted.

Figure 14A:
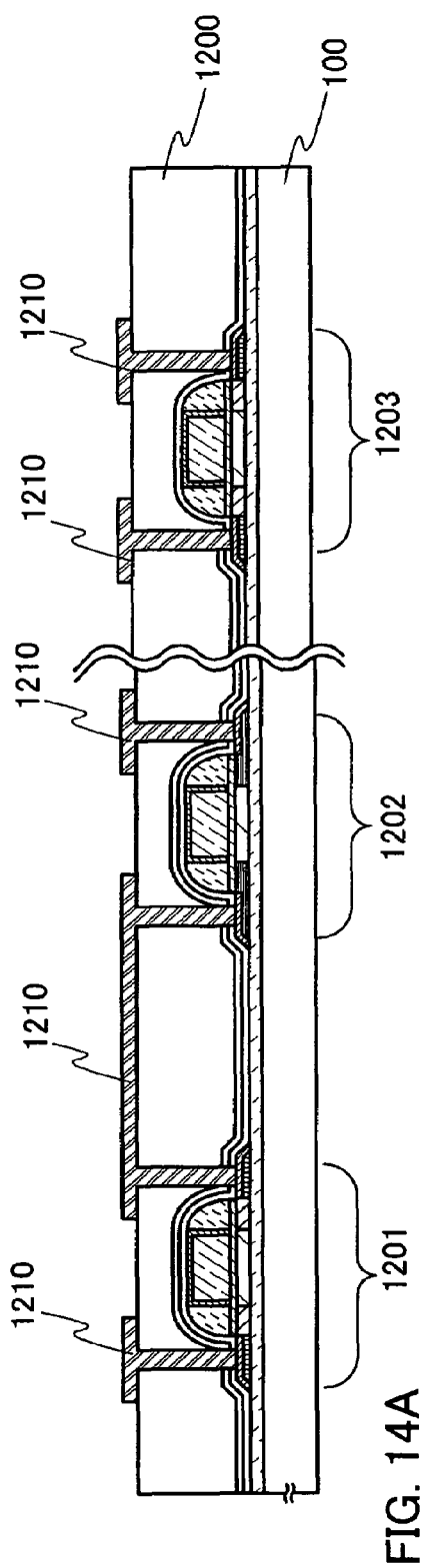
FIGS. 14A and 14B are cross-sectional views for showing a manufacturing process of a liquid crystal display device of the present invention.

By the same steps as that in Embodiment Mode 3, n-channel thin film transistors 1201 and 1203, and a p-channel thin film transistor 1202 without an LDD structure are formed over the insulating substrate 100 (FIG. 14A). However, each structure of the n-channel thin film transistor and the p-channel thin film transistor is not limited to the above structure, and any of the structures described in Embodiment Modes 1 to 3 can be employed. It is to be noted that a p-channel thin film transistor without an LDD structure can be formed by doping an impurity ion only before forming a sidewall.

Next, an interlayer insulating film 1204 is further formed over the interlayer insulating film 1200 and a wiring 1210. Then, a resist mask is formed by using a photomask, and the interlayer insulating film 1204 is partially removed by dry etching so as to form an opening (a contact hole). In the formation of this contact hole, carbon tetrafluoride ($CF_4$), oxygen ($O_2$) and helium (He) are used as an etching gas with a flow rate of $CF_4:O_2:He$ is 50:50:30 sccm. It is to be noted that the bottom surface of the contact hole reaches the wiring 1210 connected to the n-channel thin film transistor 1203.

Figure 14B:
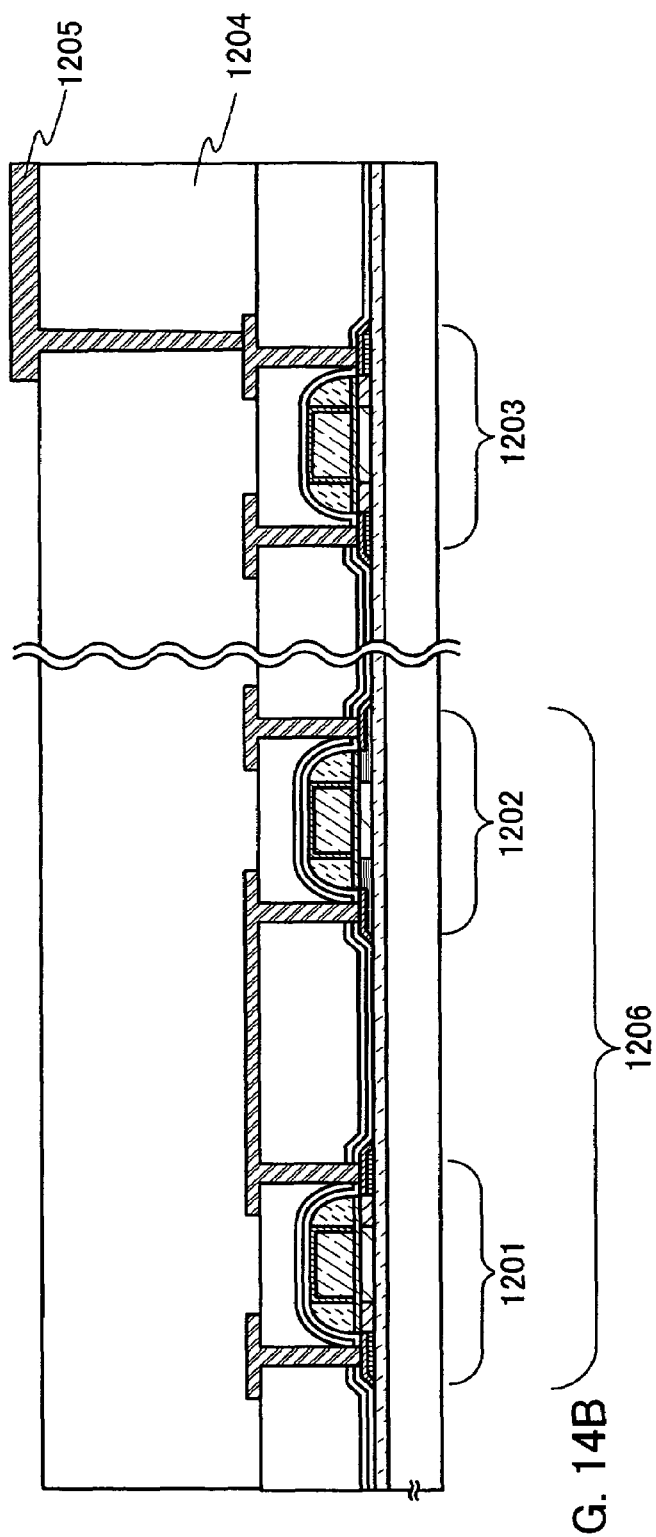

Then, after removing the resist mask, a conductive film is formed over the entire surface and etching is conducted to form a pixel electrode 1205 which is electrically connected to the n-channel thin film transistor 1203 (FIG. 14B). In this embodiment mode, a reflective liquid crystal display panel is manufactured; therefore, the pixel electrode 1205 is formed by a sputtering method using a light-reflective metal material such as Ag (silver), Au (gold), Cu (copper), W (tungsten), or Al (aluminum).

In the case of manufacturing a light-transmitting liquid crystal display panel, the pixel electrode 1205 is formed by using a transparent conductive film such as indium tin oxide, indium tin oxide containing silicon oxide, zinc oxide, or tin oxide.

Through the foregoing steps, a thin film transistor substrate of a liquid crystal display device is completed, in which the n-channel thin film transistor 1203 that is a thin film transistor of the pixel portion, a CMOS circuit 1206 including the n-channel thin film transistor 1201 and the p-channel thin film transistor 1202, and the pixel electrode 1205 are formed over the insulating substrate 100.

Figure 15:
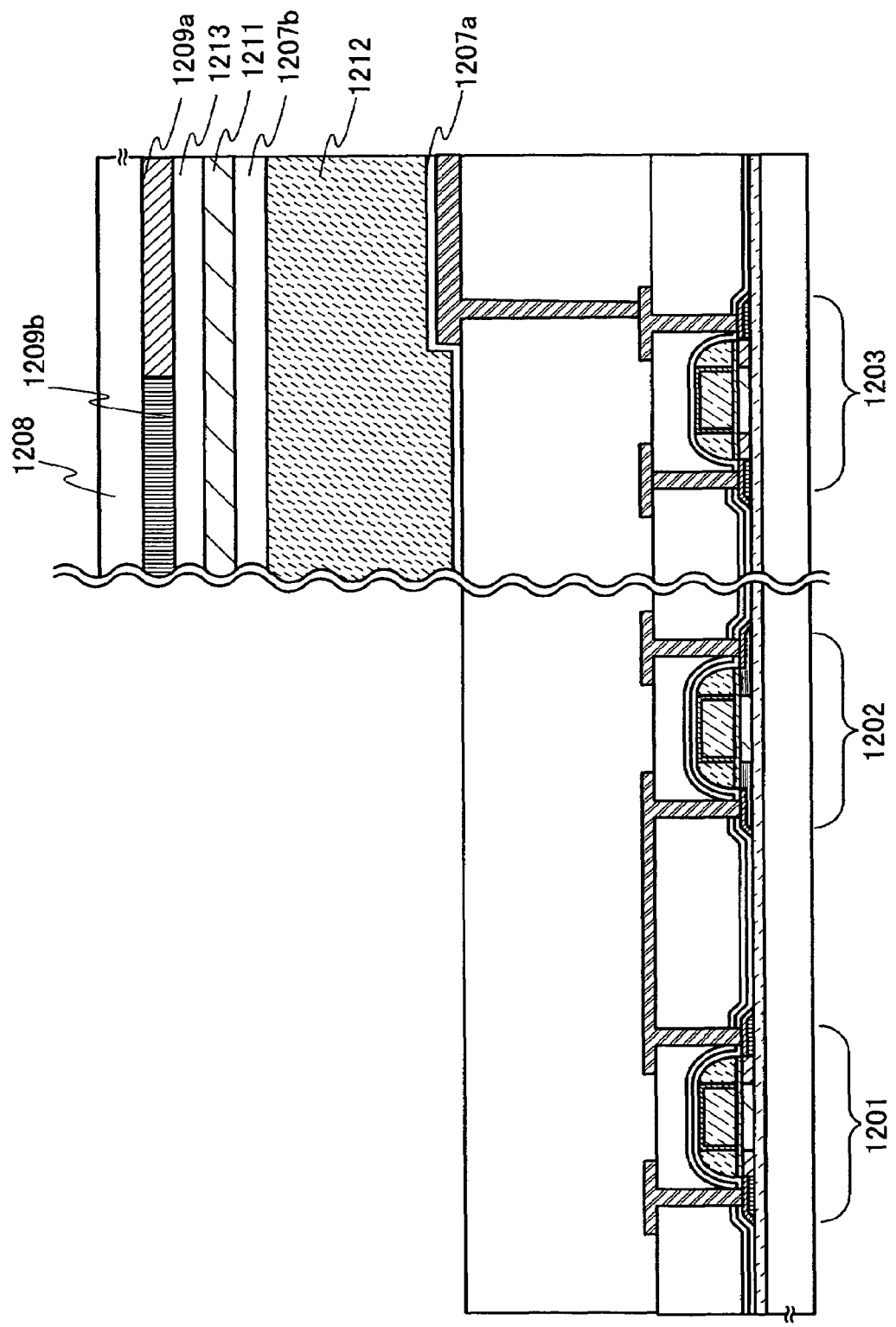
FIG. 15 is a cross-sectional view for showing a manufacturing process of a liquid crystal display device of the present invention.

Then, an orientation film 1207a is formed so as to cover the pixel electrode 1205 as shown in FIG. 15. It is to be noted that the orientation film 1207a may be formed by a droplet discharge method, a screen printing method or an offset printing method. Thereafter, a rubbing process is conducted to the surface of the orientation film 1207a.

Over a counter substrate 1208, a color filter formed of a colored layer 1209a, a light-shielding layer (black matrix) 1209b, and an overcoat layer 1213 is provided, and a counter electrode 1211 formed of a transparent electrode or a reflective electrode is formed, and then, the orientation film 1207b is formed thereover. Although not shown here, a sealing material is formed to surround a region overlapping with the pixel portion including the n-channel thin film transistor 1203 that is a pixel thin film transistor by a droplet discharge method.

Then, a liquid crystal composition 1212 is dropped at a reduced pressure so that bubbles are not mixed therein, and both the substrates 100 and 1208 are attached to each other. As an orientation mode of the liquid crystal composition 1212, a TN mode is used, in which the liquid crystal molecules are twist-aligned by 900 from the light injection point to the light emission point. The substrates are attached to each other in such a manner that the rubbing directions thereof intersect mutually perpendicular orientation with each other at right angles.

It is to be noted that the distance between a pair of the substrates may be kept by dispersing a spherical spacer or providing a columnar spacer formed of a resin, or by providing a filler in the sealing material. The aforementioned columnar spacer is formed by using an organic resin material containing at least one of acrylic, polyimide, polyimide amide, and epoxy as its main component, or an inorganic material having any of silicon oxide, silicon nitride and silicon oxide containing nitrogen, or a stacked film thereof.

As described above, a compact liquid crystal display device having a longer life can be formed in this embodiment mode. The liquid crystal display device manufactured in this embodiment mode can be used as a display portion of various electric appliances.

In this embodiment mode, the thin film transistor having a single gate structure is described; however, the present invention is not limited to the single gate structure, and a multi gate thin film transistor having a plurality of channel formation regions such as a double gate thin film transistor may also be employed.

Embodiment Mode 9

According to the present invention, various kinds of electric appliances can be manufactured. For example, a video camera, a digital camera, a projector, a head-mounted display (a goggle type display), a car navigation system, a car stereo, a personal computer, a game machine, a portable information terminal (such as a mobile computer, a cellular phone, or an electronic book), an image reproducing device provided with a recording medium (specifically, a device which can reproduce the recording medium such as a digital versatile disc (DVD) and includes a display portion capable of displaying images thereof), and the like. Specific examples thereof are shown in FIGS. 16A to 16D.

Figure 16A:
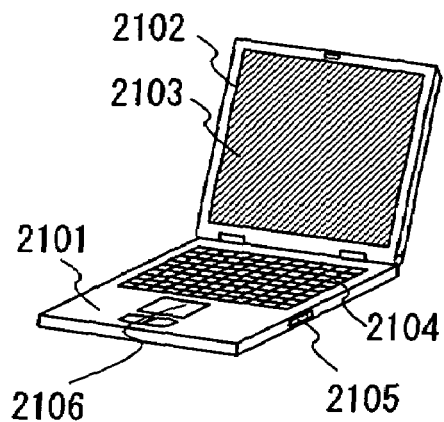
FIGS. 16A to 16D are views for electric appliances using a semiconductor device of the present invention.

FIG. 16A shows a personal computer, which includes a main body 2101, a chassis 2102, a display portion 2103, a keyboard 2104, an external connection port 2105, a pointing mouse 2106, or the like. The present invention is applied to manufacturing of the display portion 2103. According to the present invention, a personal computer with high-speed operation and high-performance can be provided.

Figure 16B:
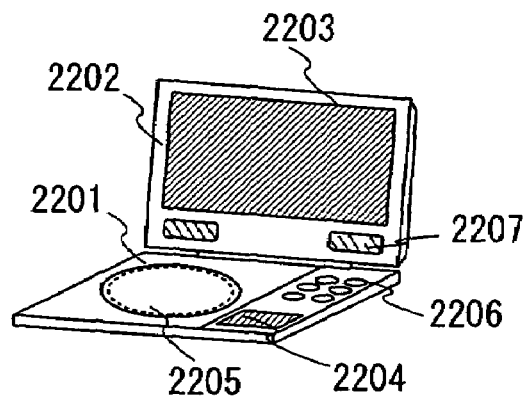

FIG. 16B shows an image reproducing device (specifically, a DVD reproducing device) including a recording medium, which includes a main body 2201, a chassis 2202, a display portion A 2203, a display portion B 2204, a recording medium (a DVD or the like) reading portion 2205, an operation key 2206, a speaker portion 2207, or the like. The display portion A 2203 mainly displays image information, and the display portion B 2204 mainly displays character information. The present invention is applied to manufacturing of the display portion A 2203 and the display portion B 2204. According to the present invention, personal computer with high-speed operation and high-performance can be provided even if the image reproducing device is miniaturized and a wiring or the like is formed precisely.

Figure 16C:
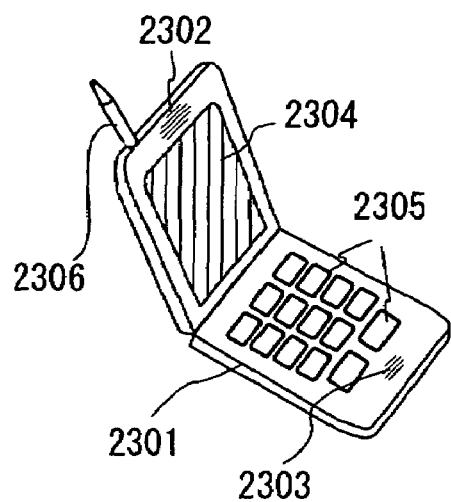

FIG. 16C shows a cellular phone, which includes a main body 2301, an audio output portion 2302, an audio input portion 2303, a display portion 2304, an operation switch 2305, an antenna 2306, or the like. By applying a display device manufactured according to the present invention to the display portion 2304, a cellular phone with high-speed operation and high-performance can be provided even if the cellular phone is miniaturized and a wiring or the like is formed precisely.

Figure 16D:
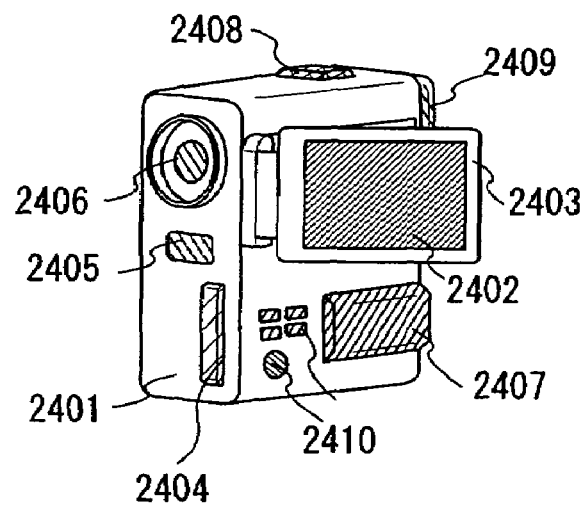

FIG. 16D shows a video camera, which includes a main body 2401, a display portion 2402, a chassis 2403, an external connection port 2404, a remote control receiver 2405, an image receiving portion 2406, a battery 2407, an audio input portion 2408, an eye piece portion 2409, operation keys 2410, or the like. The present invention can be applied to manufacturing of the display portion 2402. By applying the display device manufactured according to the present invention to the display portion 2402, a highly reliable video camera which can display a high-quality image can be manufactured even if the video camera is miniaturized and a wiring or the like is formed precisely. This embodiment mode can be freely combined with the foregoing embodiment modes.

In particular, the display device used for the display portion of such electric appliances includes thin film transistors for driving pixels, and desired structures of the thin film transistors differ from one another depending on the circuit. By applying the present invention, thin film transistors having suitable structures for the various circuits can be manufactured with high accuracy; therefore, a high-quality electric appliance can be manufactured with a high yield.

As described above, the applicable range of the present invention is extremely wide, and the present invention can be applied to electric appliances of various fields.

This application is based on Japanese Patent Application serial no. 2005-133661 filed in Japan Patent Office on Apr. 28, in 2005, the entire contents of which are hereby incorporated by reference.

What is claimed is:

1. A method for manufacturing a thin film transistor comprising the steps of:
    forming an amorphous semiconductor film over a substrate having an insulating surface;
    forming a crystalline semiconductor film by crystallizing the amorphous semiconductor film;
    forming an island-shaped semiconductor film by etching the crystalline semiconductor film;
    forming a gate insulating film over the island-shaped semiconductor film;
    forming a conductive film over the gate insulating film;
    forming a gate electrode by etching the conductive film; and
    slimming the gate electrode by oxidizing a surface of the gate electrode using high-density plasma.

2. The method according to claim 1, wherein a high electron density of the high-density plasma is $1.0 \times 10^{11}$ cm$^{-3}$ to $1.0 \times 10^{13}$ cm$^{-3}$ and an electron temperature is 0.5 to 1.5 eV.

3. The method according to claim 1, wherein the surface of the gate electrode is oxidized using a mixed gas of oxygen, hydrogen, and argon in the slimming step.

4. The method according to claim 1, wherein an oxide film formed on the surface of the gate electrode contains a rare gas element.

5. A method for manufacturing a thin film transistor comprising the steps of:
    forming an amorphous semiconductor film over a substrate having an insulating surface;
    forming a crystalline semiconductor film by crystallizing the amorphous semiconductor film;
    forming an island-shaped semiconductor film by etching the crystalline semiconductor film;
    forming a gate insulating film over the island-shaped semiconductor film;
    forming a conductive film over the gate insulating film;
    forming a gate electrode by etching the conductive film;
    slimming the gate electrode by oxidizing a surface of the gate electrode using high-density plasma; and
    removing an oxide film formed over the surface of the gate electrode.

6. The method according to claim 5, wherein a high electron density of the high-density plasma is $1.0 \times 10^{11}$ cm$^{-3}$ to $1.0 \times 10^{13}$ cm$^{-3}$ and an electron temperature is 0.5 to 1.5 eV.

7. The method according to claim 5, wherein the surface of the gate electrode is oxidized using a mixed gas of oxygen, hydrogen, and argon in the slimming step.

8. A method for manufacturing a thin film transistor comprising the steps of:
    forming an amorphous semiconductor film over a substrate having an insulating surface;
    forming a crystalline semiconductor film by crystallizing the amorphous semiconductor film;
    forming an island-shaped semiconductor film by etching the crystalline semiconductor film;
    forming a gate insulating film over the island-shaped semiconductor film;
    forming a conductive film over the gate insulating film;
    forming a gate electrode by etching the conductive film;
    slimming the gate electrode by oxidizing a surface of the gate electrode using high-density plasma;
    doping the island-shaped semiconductor film with first impurity ion using the gate electrode as a mask;
    forming a sidewall on a side surface of the gate electrode; and
    doping the island-shaped semiconductor film with second impurity ion to have a higher concentration of that of the first impurity ion, using the gate electrode and the sidewall as a mask.

9. The method according to claim 8, wherein a high electron density of the high-density plasma is $1.0 \times 10^{11}$ cm$^{-3}$ to $1.0 \times 10^{13}$ cm$^{-3}$ and an electron temperature is 0.5 to 1.5 eV.

10. The method according to claim 8, wherein the first impurity ion and the second impurity ion are a same impurity ion.

11. The method according to claim 8, wherein the surface of the gate electrode is oxidized using a mixed gas of oxygen, hydrogen, and argon in the slimming step.

12. The method according to claim 8, wherein an oxide film formed on the surface of the gate electrode contains a rare gas element.

13. A method for manufacturing a thin film transistor comprising the steps of:
    forming an amorphous semiconductor film over a substrate having an insulating surface;
    forming a crystalline semiconductor film by crystallizing the amorphous semiconductor film;
    forming an island-shaped semiconductor film by etching the crystalline semiconductor film;
    forming a gate insulating film over the island-shaped semiconductor film;
    forming a conductive film over the gate insulating film;
    forming a gate electrode by etching the conductive film;
    slimming the gate electrode by oxidizing a surface of the gate electrode using high-density plasma;
    removing an oxide film formed over the surface of the gate electrode;
    doping the island-shaped semiconductor film with first impurity ion using the gate electrode as a mask;
    forming a sidewall on a side surface of the gate electrode; and
    doping the island-shaped semiconductor film with second impurity ion to have a higher concentration of that of the first impurity ion, using the gate electrode and the sidewall as a mask.

14. The method according to claim 13, wherein a high electron density of the high-density plasma is $1.0 \times 10^{11}$ cm$^{-3}$ to $1.0 \times 10^{13}$ cm$^{-3}$ and an electron temperature is 0.5 to 1.5 eV.

15. The method according to claim 13, wherein the first impurity ion and the second impurity ion are a same impurity ion.

16. The method according to claim 13, wherein the surface of the gate electrode is oxidized using a mixed gas of oxygen, hydrogen, and argon in the slimming step.

* * * * *